(12) United States Patent
Hong

(10) Patent No.: US 9,202,800 B2
(45) Date of Patent: Dec. 1, 2015

(54) METHODS FOR PRODUCING A BOND AND A SEMICONDUCTOR MODULE

(71) Applicant: Infineon Technologies AG, Neubiberg (DE)

(72) Inventor: Tao Hong, Soest (DE)

(73) Assignee: Infineon Technologies AG, Neubiberg (DE)

( * ) Notice: Subject to any disclaimer, the term of this patent is extended or adjusted under 35 U.S.C. 154(b) by 166 days.

(21) Appl. No.: 13/939,635

(22) Filed: Jul. 11, 2013

(65) Prior Publication Data

US 2014/0013595 A1 Jan. 16, 2014

(30) Foreign Application Priority Data

Jul. 12, 2012 (DE) .......................... 10 2012 212 249

(51) Int. Cl.
*H05K 3/00* (2006.01)
*H01L 23/00* (2006.01)
*H01L 25/07* (2006.01)

(52) U.S. Cl.
CPC ................ *H01L 24/89* (2013.01); *H01L 24/75* (2013.01); *H01L 24/83* (2013.01); *H01L 24/05* (2013.01); *H01L 24/27* (2013.01); *H01L 24/29* (2013.01); *H01L 24/32* (2013.01); *H01L 25/072* (2013.01); *H01L 2224/04026* (2013.01); *H01L 2224/05639* (2013.01); *H01L 2224/05644* (2013.01); *H01L 2224/05647* (2013.01); *H01L 2224/2732* (2013.01); *H01L 2224/27334* (2013.01); *H01L 2224/27418* (2013.01); *H01L 2224/2919* (2013.01); *H01L 2224/29111* (2013.01);

(Continued)

(58) Field of Classification Search
CPC ......... H01L 24/03; H01L 24/06; H01L 24/24; H01L 24/27; H01L 24/29; H01L 24/32; H01L 24/72; H01L 24/73; H01L 24/743; H01L 24/75; H01L 24/83; H01L 24/89; Y10T 29/49117; Y10T 29/49121; Y10T 29/49137; Y10T 29/49163; Y10T 29/49169; Y10T 29/49171; Y10T 29/49197; Y10T 29/4921; Y10T 29/49719; Y10T 29/49826; Y10T 29/49904; Y10T 29/49915; Y10T 29/5313; Y10T 29/53178; Y10T 29/53191
USPC .............. 29/402.02, 428, 469, 509, 729, 740, 29/743, 760, 825, 827, 851, 854, 855, 870, 29/877; 156/60, 382; 228/57, 101; 438/121
See application file for complete search history.

(56) References Cited

U.S. PATENT DOCUMENTS 3,885,390 A * 5/1975 Evans .............................. 60/531
6,328,362 B1 * 12/2001 Isogai et al. ................... 294/185

(Continued)

*Primary Examiner* — Paul D Kim
(74) *Attorney, Agent, or Firm* — Murphy, Bilak & Homiller, PLLC

(57) ABSTRACT

A pressure chamber has first and second housing elements and first and second chamber regions. The pressure chamber is loaded with a first part, a second part, a connecting means and a sealing means. The connecting means is arranged in the first chamber region. The loaded pressure chamber is placed into a receiving region. The first housing element is pressed against the second housing element so that the pressure chamber is clamped with the aid of a working cylinder between the working cylinder and a holding frame. In the clamped state, a second gas pressure, which is higher than a first gas pressure in the first chamber region, is generated in the second chamber region. In this way, the first part, the second part and the connecting means are pressed against one another within the pressure chamber.

19 Claims, 21 Drawing Sheets

(52) U.S. Cl.
CPC ............ *H01L2224/29294* (2013.01); *H01L 2224/29339* (2013.01); *H01L 2224/32225* (2013.01); *H01L 2224/7511* (2013.01); *H01L 2224/7532* (2013.01); *H01L 2224/75251* (2013.01); *H01L 2224/75315* (2013.01); *H01L 2224/81005* (2013.01); *H01L 2224/83054* (2013.01); *H01L 2224/83055* (2013.01); *H01L 2224/8381* (2013.01); *H01L 2224/8384* (2013.01); *H01L 2224/83093* (2013.01); *H01L 2224/83191* (2013.01); *H01L 2224/83192* (2013.01); *H01L 2224/83193* (2013.01); *H01L 2224/83222* (2013.01); *H01L 2224/83439* (2013.01); *H01L 2224/83444* (2013.01); *H01L 2224/83851* (2013.01); *H01L 2924/1203* (2013.01); *H01L 2924/1301* (2013.01); *H01L 2924/1306* (2013.01); *H01L 2924/13055* (2013.01); *H01L 2924/13091* (2013.01); *H01L 2924/15787* (2013.01); *Y10T 29/49117* (2015.01); *Y10T 156/10* (2015.01)

(56) References Cited

U.S. PATENT DOCUMENTS

| | | | | |
|---|---|---|---|---|
| 6,644,941 | B1* | 11/2003 | Able et al. | 417/393 |
| 7,096,774 | B2* | 8/2006 | Hellgren | 92/86 |
| 7,445,543 | B2* | 11/2008 | Torii et al. | 451/289 |
| 2003/0016510 | A1* | 1/2003 | Knapp | 361/761 |
| 2013/0203218 | A1* | 8/2013 | Bayerer et al. | 438/121 |

* cited by examiner

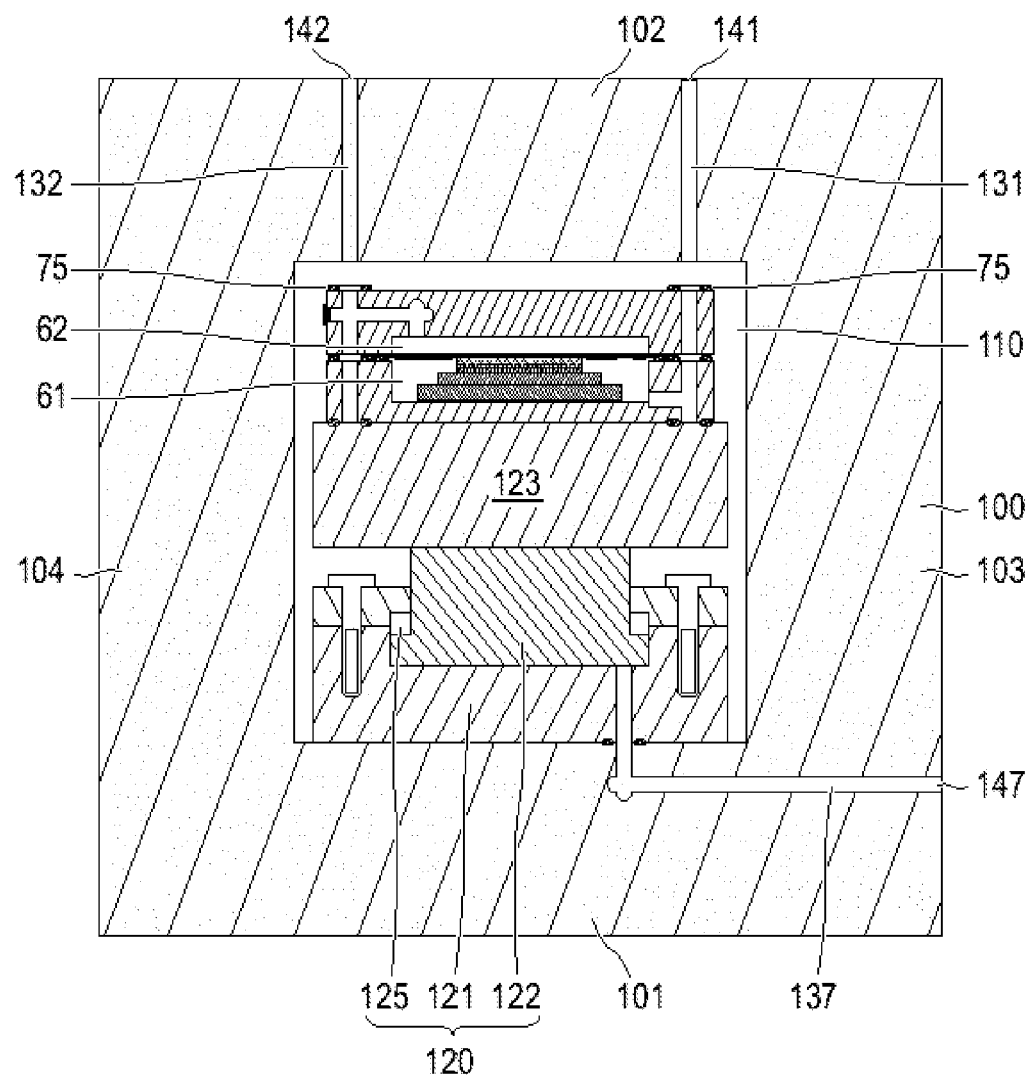

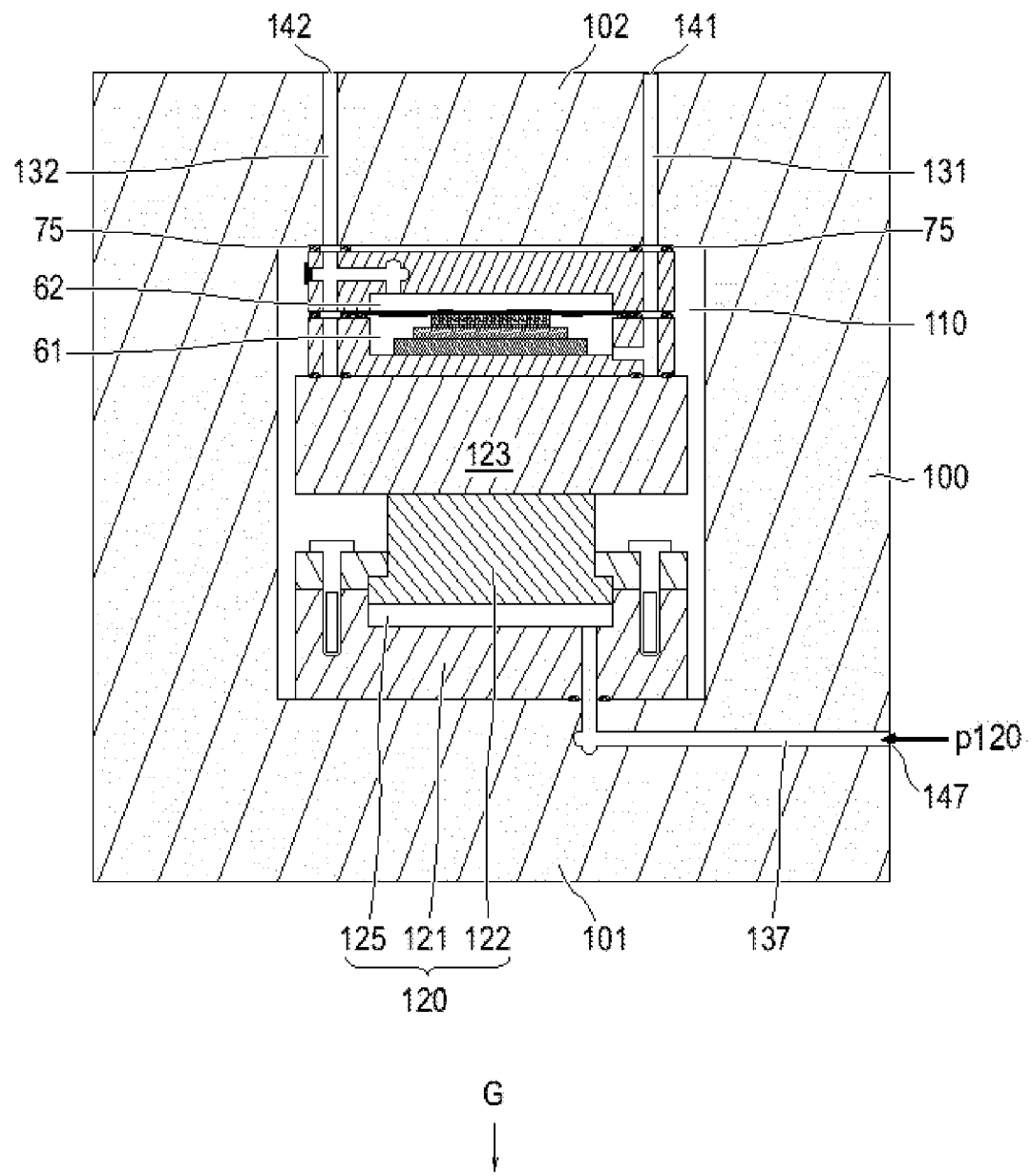

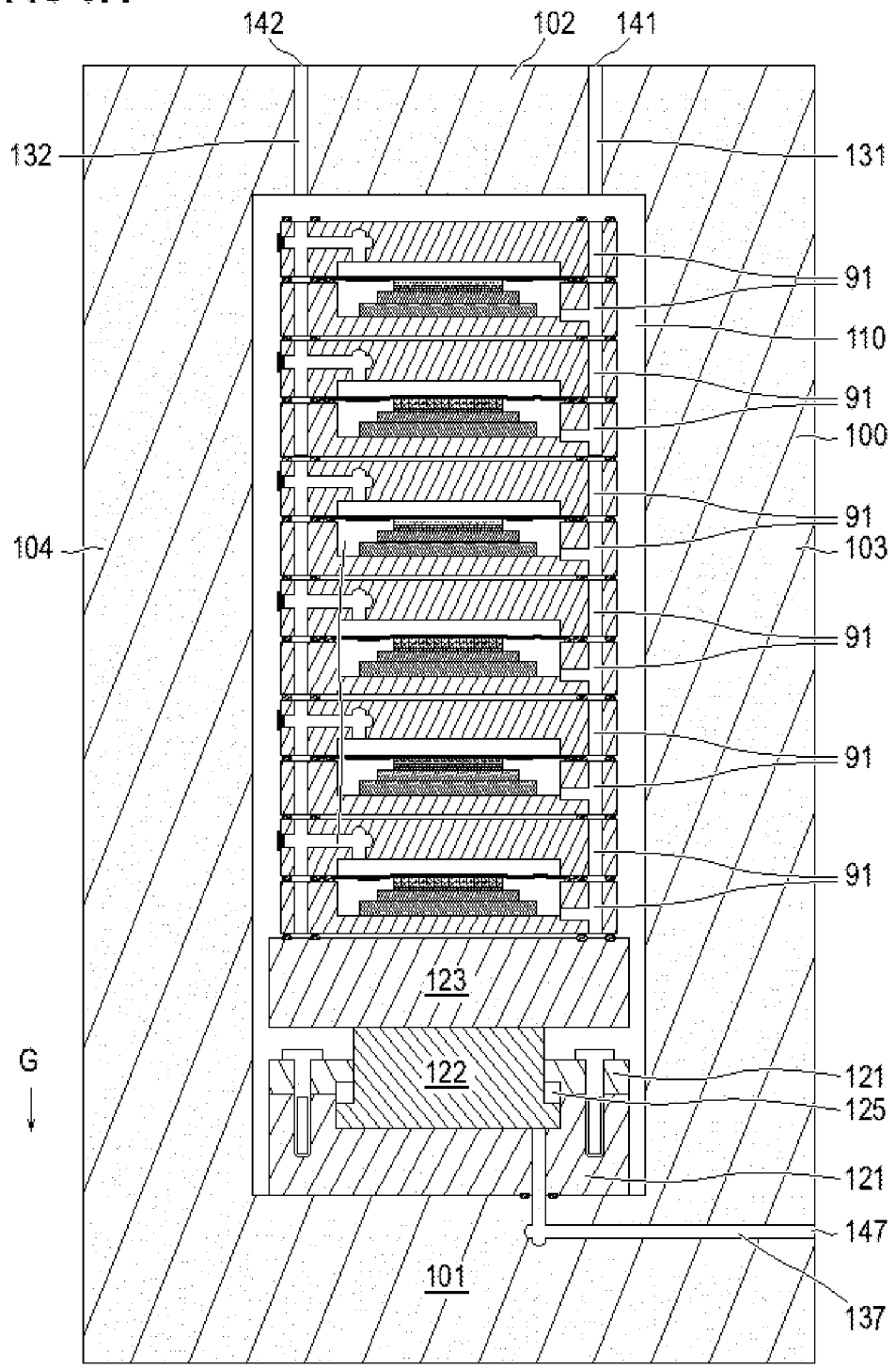

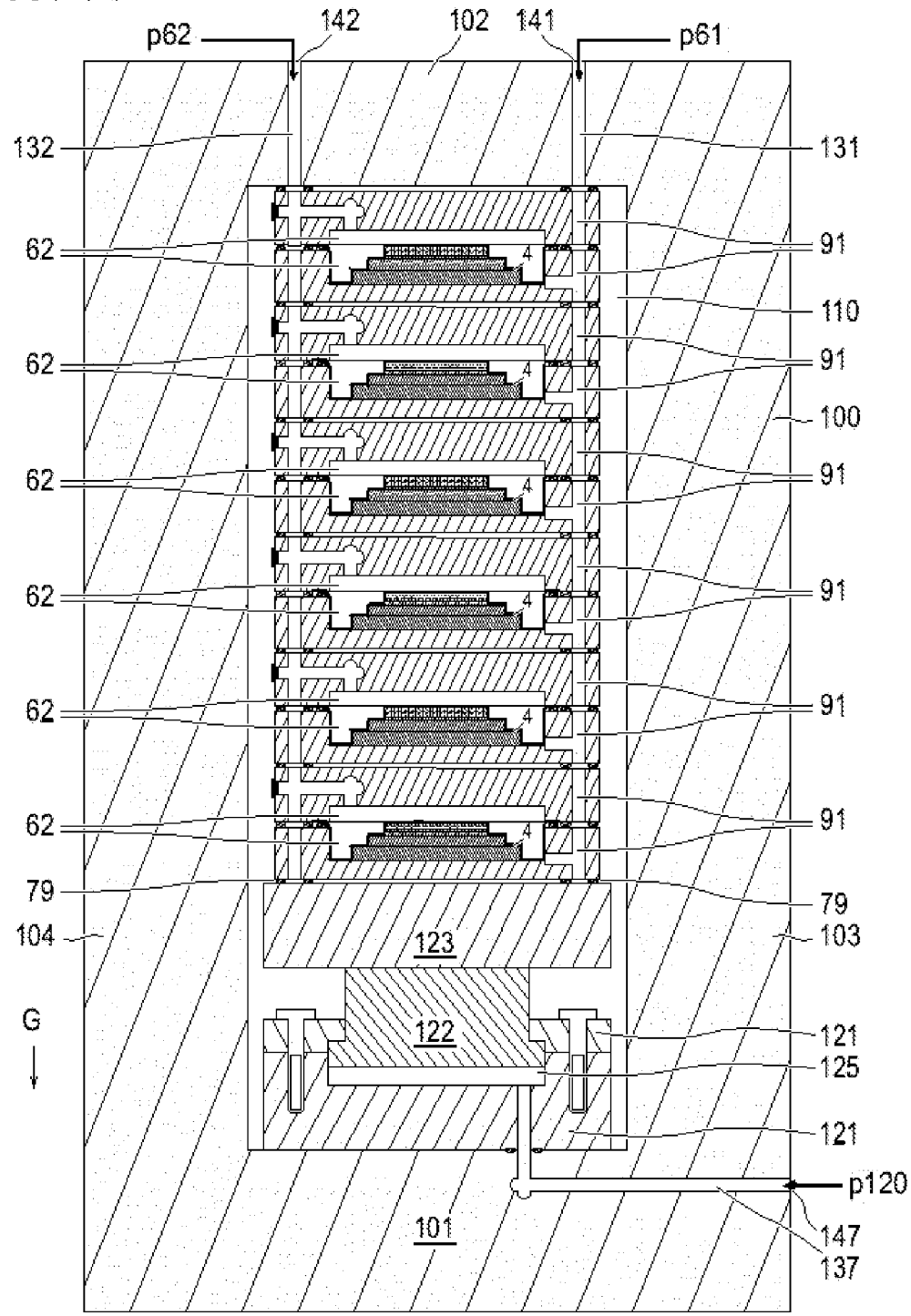

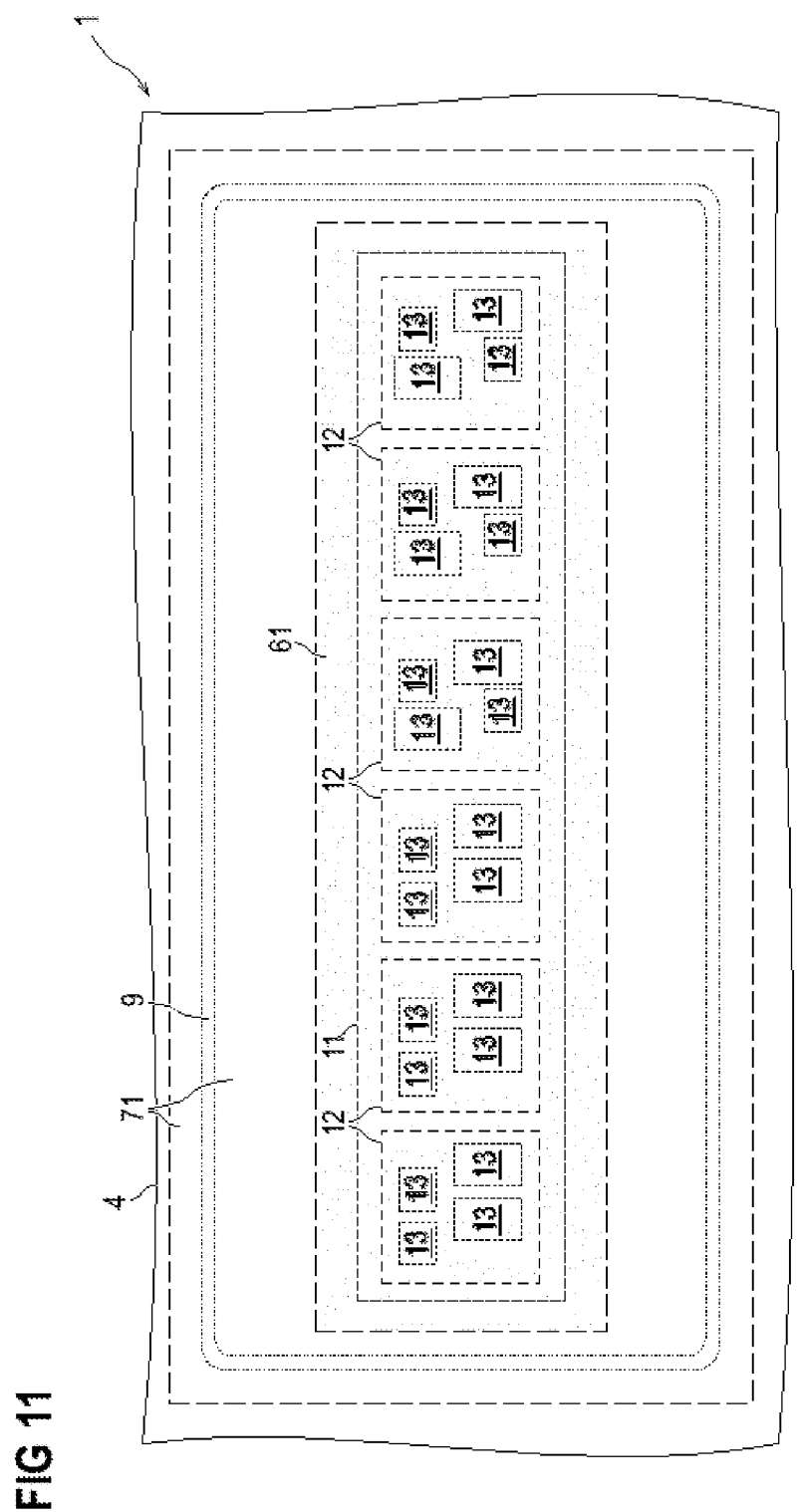

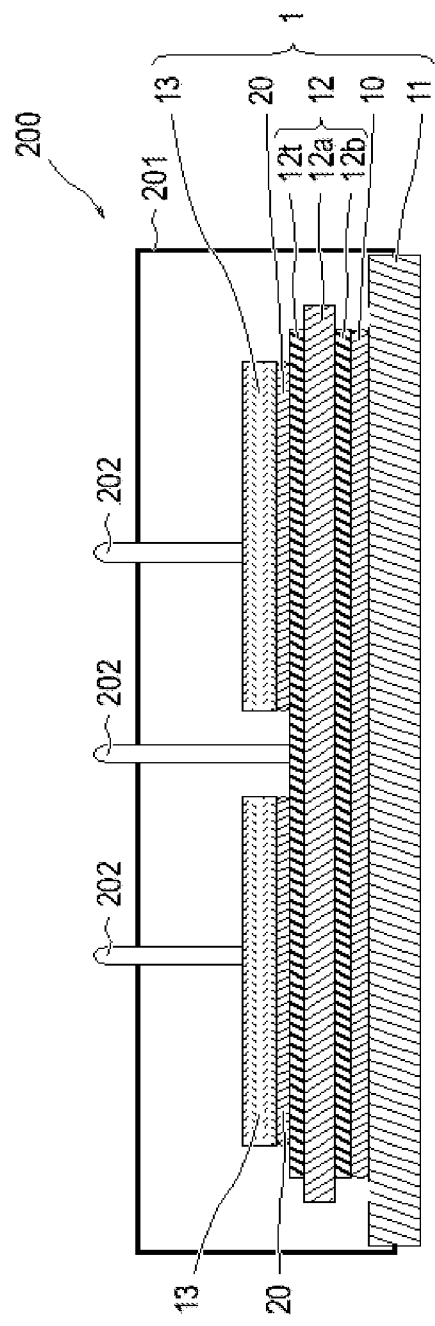

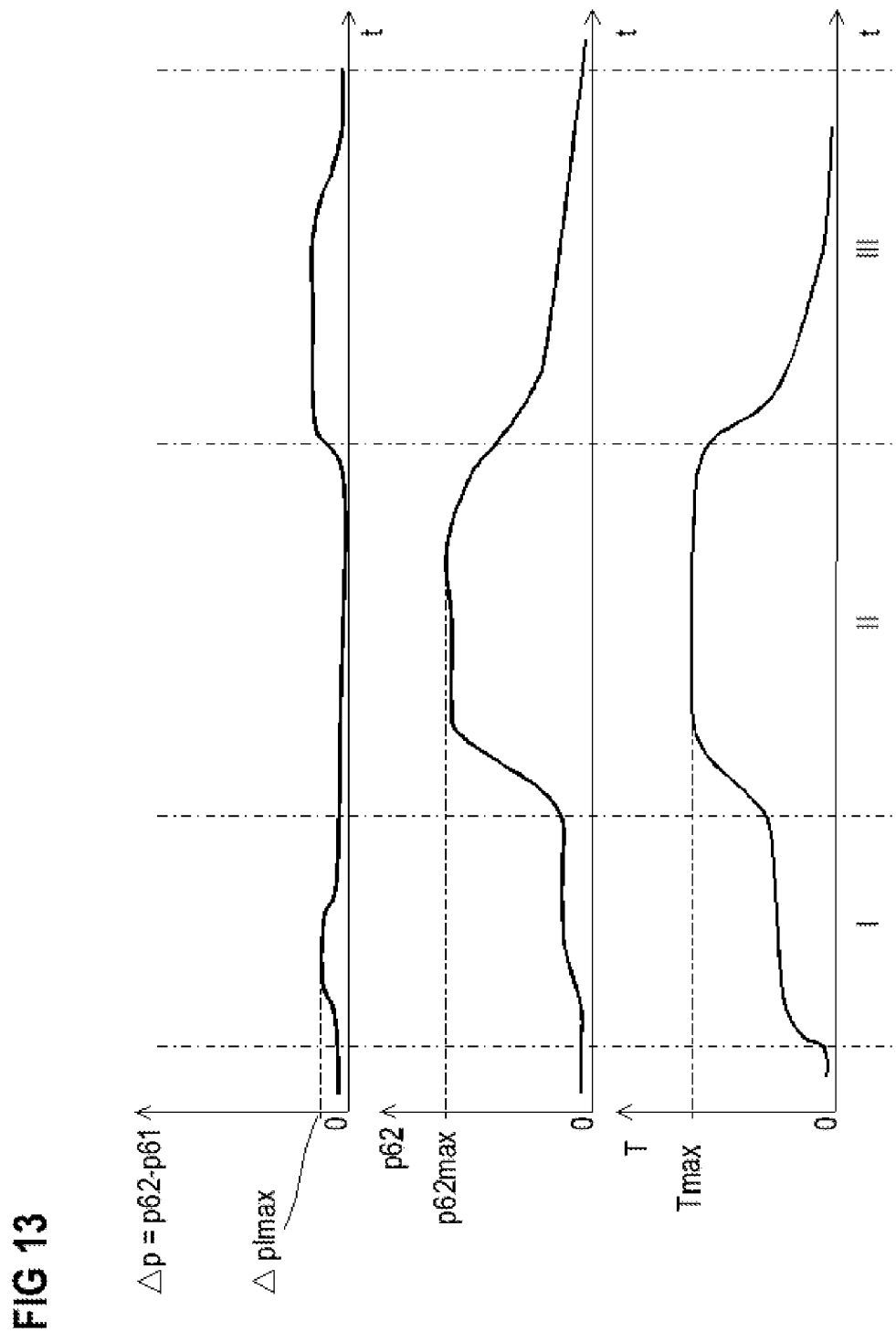

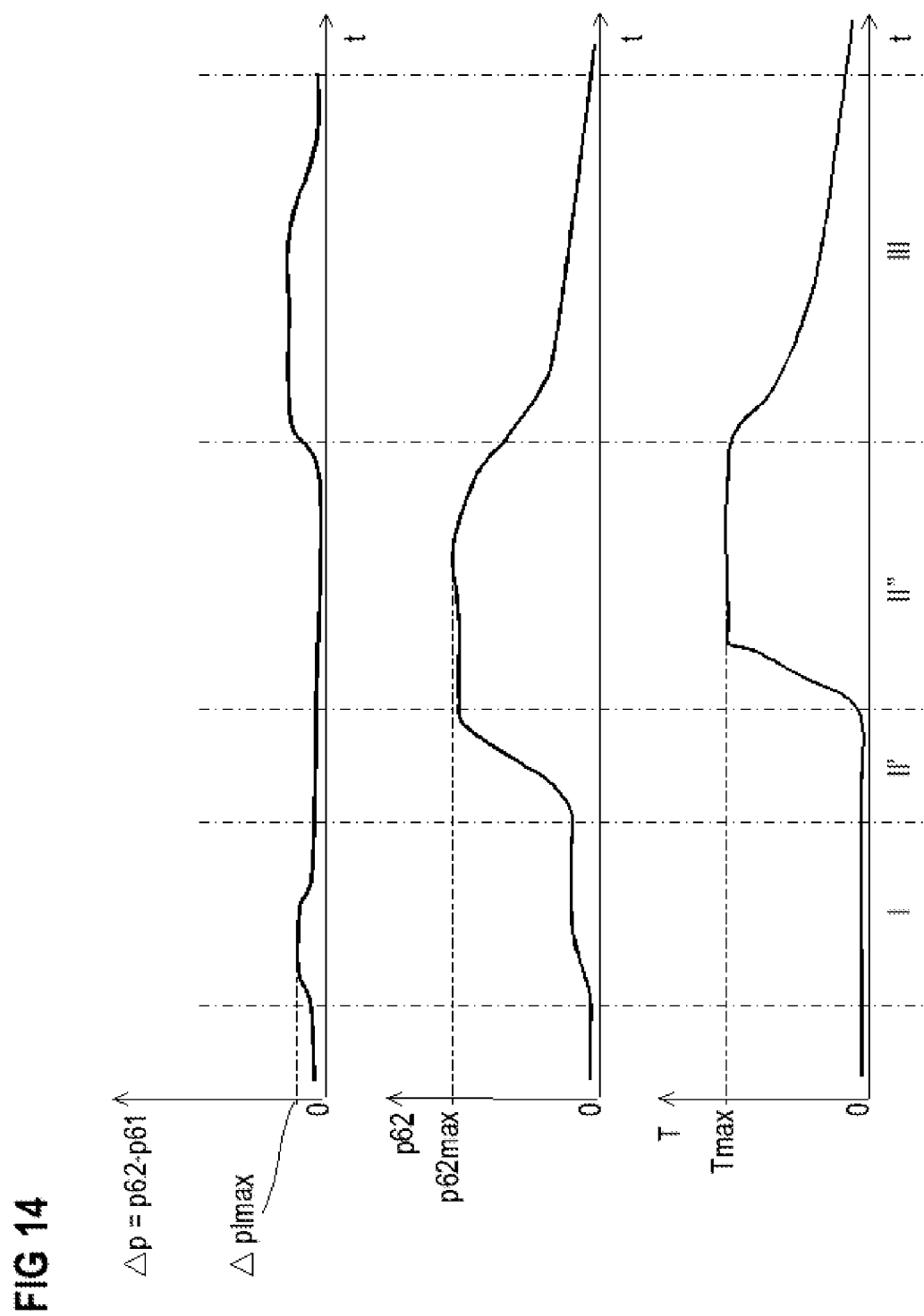

METHODS FOR PRODUCING A BOND AND A SEMICONDUCTOR MODULE

PRIORITY CLAIM

This application claims priority to German Patent Application No. 10 2012 212 249.4, filed on 12 Jul. 2012, the content of said German application incorporated herein by reference in its entirety.

TECHNICAL FIELD

The present invention relates to methods for producing a bond and a semiconductor module with such a bond.

BACKGROUND

In many technical areas it is necessary to connect two or more parts to be joined to one another with a material bond and for this purpose to press the parts to be joined against one another with great pressing pressure. In the case of conventional methods there is often the risk of the parts to be joined being damaged or contaminated with foreign substances, such as for example oil, during or after the connecting process. Furthermore, very large frames and presses, which withstand the high forces occurring during the pressing operation, are used in the case of the conventional methods. On account of their size, however, these frames and presses are expensive, unwieldy and also require considerable space. It is also often difficult in the case of conventional methods to position the parts to be joined in the press, since they generally have to be positioned exactly in register on one another in the press before the pressing operation.

SUMMARY

One embodiment relates to a method for producing a bond in which at least two parts to be joined are solidly connected to one another. For this purpose, a holding frame with a receiving region is provided, and also a working cylinder. Also provided is/are a number of N≥1 pressure chamber(s), where N=1 or N≥2. Each one of the pressure chambers has at least a first housing element and a second housing element.

For each of the pressure chambers there is provided a set comprising a first part to be joined, a second part to be joined, a connecting means and a sealing means. Optionally, each set may also contain other elements. Each pressure chamber is loaded with a corresponding set, to be precise such that the first part to be joined, the second part to be joined and the connecting means are arranged in the respective pressure chamber in such a way that the connecting means is located between the first part to be joined and the second part to be joined. At the same time, at least the connecting means is arranged in a first chamber region of the pressure chamber. After it has been loaded in this way, each pressure chamber is placed into the receiving region. After that, the first housing element is pressed against the second housing element in the case of each pressure chamber, in that the pressure chamber placed in the receiving region is clamped with the aid of the working cylinder between the working cylinder and the holding frame.

In the clamped state, a second gas pressure, which is higher than a first gas pressure in the first chamber region, is generated in a second chamber region of the pressure chamber. In this way, the first part to be joined, the second part to be joined and the connecting means located between the first and second parts are pressed against one another within the respective pressure chamber.

If the actuation of the working chamber takes place pneumatically with a working pressure, this working pressure and the second gas pressure may optionally be fed from the same source, i.e. a working volume of the working cylinder and the second chamber region are connected to the same pressure volume, at least for a time, during the clamped state, so that therefore, at least for a time, there is a continuous pneumatic connection between the working volume and the second chamber region.

According to a further option, the pressure chambers may also serve as work carriers and be fed by way of a conveying system together with the parts to be joined placed in them to the holding frame and removed again from the latter after the joining process.

With a bond produced in this way, a semiconductor module can be produced if the first part to be joined is formed as a leadframe, which has a dielectric ceramic platelet that is coated with a metallization and if the second part to be joined is a semiconductor chip. For this purpose, a mechanical connection and an electrically conducting connection are established between a contact element and the bond. This arrangement is arranged in the interior of the module housing in such a way that the contact element extends from the interior of the module housing to the outer side thereof and can be electrically contacted there.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3B shows a vertical section through the holding frame shown in FIG. 3A after the placement in the receiving region of the holding frame of a pressure chamber formed and loaded according to FIG. 2;

FIG. 3C shows a vertical section through the arrangement according to FIG. 3B after the actuation of the working cylinder;

FIG. 5A shows a vertical section through a holding frame in the receiving region of which a number of pressure chambers formed and loaded according to FIG. 2 have been placed;

FIG. 5C shows a vertical section through the arrangement according to FIG. 5B, while a second chamber region is being subjected to a second gas pressure in the case of each of the placed pressure chambers;

FIG. 11 shows a plan view of a first housing element onto which a stack of parts to be joined has been placed;

FIG. 12 shows a vertical section through a semiconductor module which comprises a bond produced according to the present invention;

FIGS. 13-14 show various examples of possible variations over time of the first and second pressures and of the temperature of the connecting means during a joining process with a connecting means formed as a sintering paste or as an adhesive;

DETAILED DESCRIPTION

Figure 1A:
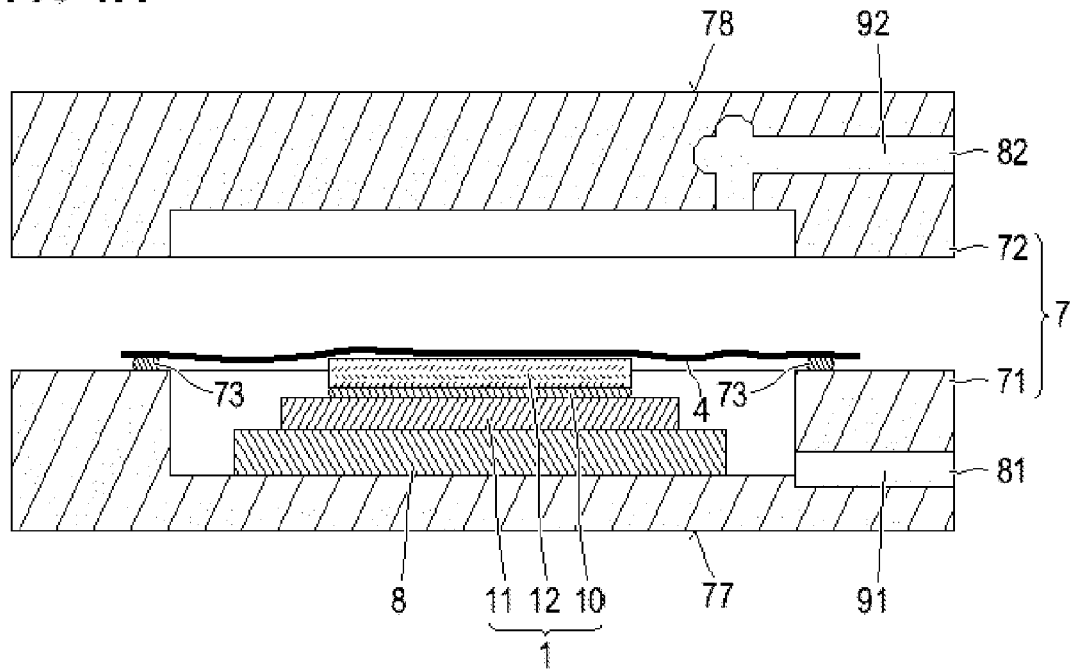
FIG. 1A shows a vertical section through an opened pressure chamber, in which two parts to be joined, a connecting means and a sealing means formed as a film are arranged.

FIG. 1A shows a cross section through an opened pressure chamber 7, which comprises a first housing element 71 and a second housing element 72. Placed in the pressure chamber 7 is a stack 1 with a first part 11 to be joined, a second part 12 to be joined, to be connected to the first part 11 to be joined, and a connecting means 10. The first part 11 to be joined may be, for example, a metallized ceramic substrate and the second part 12 to be joined may be a semiconductor chip, for example an IGBT, a MOSFET, a junction-gate field-effect transistor, a thyristor, or any other desired controllable power semiconductor chip, or a diode. Similarly, the first part 11 to be joined may also be a metal plate and the second part 12 to be joined may be a metallized ceramic substrate. In principle, however, the first and second parts 11, 12 to be joined may be any desired elements to be connected to one another. Therefore, the parts 11, 12 to be joined are in each case only represented schematically.

The connecting means 10 serves the purpose of connecting the first part 11 to be joined with a material bond to the second part 12 to be joined during a connecting process after the closing of the pressure chamber 7. The connecting process may be, for example, a soldering, sintering or adhesive-bonding process. Correspondingly, the connecting means 10 may, depending on the desired process, be a solder, an adhesive or a sinterable paste. The paste may, for example, contain silver powder and/or silver flakes, and also a solvent. In the case of a sinterable paste, it may be applied to one or both parts 11, 12 to be joined. It is similarly possible to apply a sinterable layer to one or both parts 11, 12 to be joined by spraying, screen printing or stencil printing of sinterable material.

A sinterable material may, for example, be produced from a paste which comprises silver powder that is provided with a solvent and is consequently capable of being spread, printed or sprayed, and thus can be applied to one or both parts 11, 12 to be joined. After being applied, the paste may be dried by evaporation of the solvent. To assist this drying process, the temperature of the paste may be increased significantly with respect to room temperature (20° C.) and/or the absolute pressure of the atmosphere surrounding the applied paste may be reduced to a value of significantly less than 1000 hPa. If the connecting means 10 is a sinterable material, it is advantageous if the mutually facing surfaces of the parts 11, 12 to be joined consist of a precious metal, for example gold or silver. For this purpose, the parts 11, 12 to be joined may, independently of one another, consist of the precious metal or be provided with a layer of the precious metal.

Also provided is an optional heating element 8, which serves the purpose of heating the first part 11 to be joined, the second part 12 to be joined and the connecting means 10 during the subsequent connecting process, so that the temperature T of the connecting means 10 follows a specific variation in temperature over time during the connecting process. The heating element 8 may in this case rest loosely on the first housing element 71 or else be solidly connected to the first housing element 71. Irrespective of this, the stack 1 is placed loosely on the heating element 8. If no heating element 8 is present or the heating element 8 is integrated in the first housing element 71, the stack 1 is placed loosely onto the first housing element 71.

As in the case of all other possible configurations of the invention, the heating element 8 may be formed as an electrical resistance heating element, or as a metal plate, for example of aluminum, which heats inductively. The required electrical connection lines or a possible inductor are not represented in the figures.

The pressure chamber 7 comprises a first housing element 71 and a second housing element 72, which are movable in relation to one another, so that the pressure chamber 7 can be opened in order to load it with two or more parts 11, 12 to be joined and a corresponding number of connecting means 10, or in order to remove a completed bond between two or more parts 11, 12 to be joined from the pressure chamber 7.

In the closed state of the pressure chamber 7, the first housing element 71 and the second housing element 72 are pressed against one another using a seal 73 located between the housing elements 71 and 72, so that the gap 74 between the first housing element 71 and the second housing element 72 is gastight.

Figure 1B:
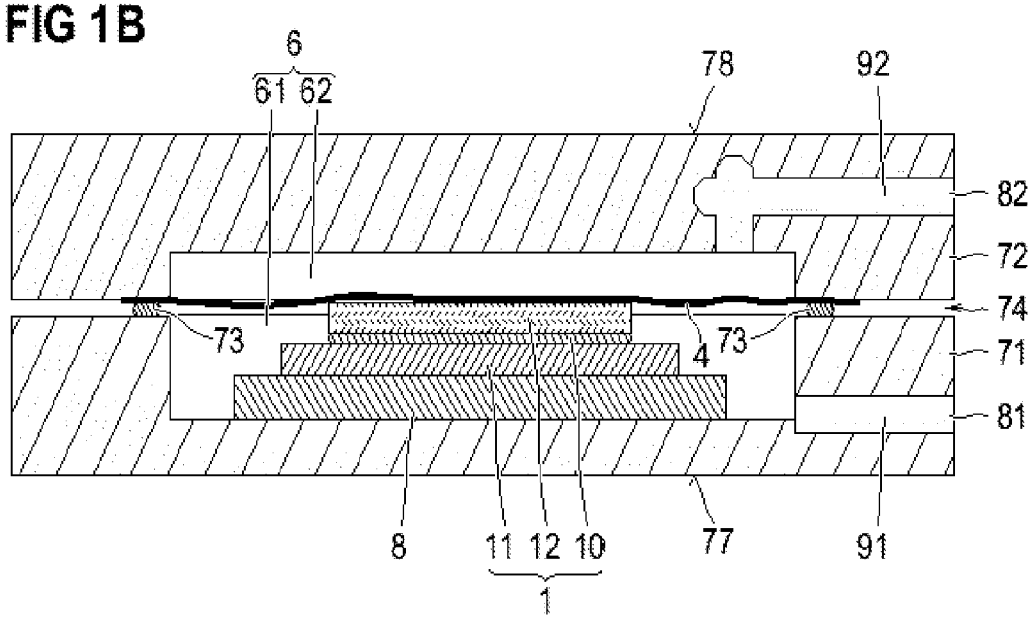
FIG. 1B shows the closed pressure chamber according to FIG. 1A.

A sealing means 4 formed as a film is placed over the stack 1 such that, with the pressure chamber 7 closed, when the housing elements 71 and 72 are pressed against one another the sealing means 4 is clamped between the housing elements 71 and 72 while running around in the gap 74, and together with the seal 73 seals off the gap 74, the result of which is shown in FIG. 1B. Alternatively, the sealing means 4 configured as a film may assume the function of the seal 73 on its own, so that it is possible to dispense with a separate seal 73. The volume of the interior space 6 of the closed pressure chamber 7 may in principle be as desired, but in the case of this pressure chamber 7, as in the case of all other pressure chambers 7 according to the present invention, it may be chosen to be less than or equal to 200 ml. A suitable material for the film 4 is e.g. polytetrafluoroethylene (PTFE).

With the pressure chamber 7 closed, the film 4 divides its interior space 6 into a first chamber region 61 and a second chamber region 62 and prevents a gas exchange from taking place between the first chamber region 61 and the second chamber region 62 within the interior space 6 (apart from a very slight residual diffusion that may take place through the film, which however does not have any disadvantageous effect on the present method). The first chamber region 61 and the second chamber region 62 are therefore separated from one another in a substantially gastight manner by the film 4, so that a difference in the gas pressure in the two chamber regions 61 and 62 can only equalize itself extremely slowly.

The pressure chamber 7 is provided with an optional first pressure connection 81 and a second pressure connection 82, which are connected by means of a first connecting line 91 and by means of a second connecting line 92 to the first chamber region 61 and to the second chamber region 62, respectively. By way of the first pressure connection 81 and the first connecting line 91, the first chamber region 61 can be subjected to a first gas pressure p61. Correspondingly, the second chamber region 62 can be subjected to a second gas pressure p62 by way of the second pressure connection 82 and the second connecting line 92. In principle, any desired gas may be used as the gas, for example air, nitrogen (N2), oxygen (O2), argon (Ar2), helium (He2) or forming gas.

Figure 1C:
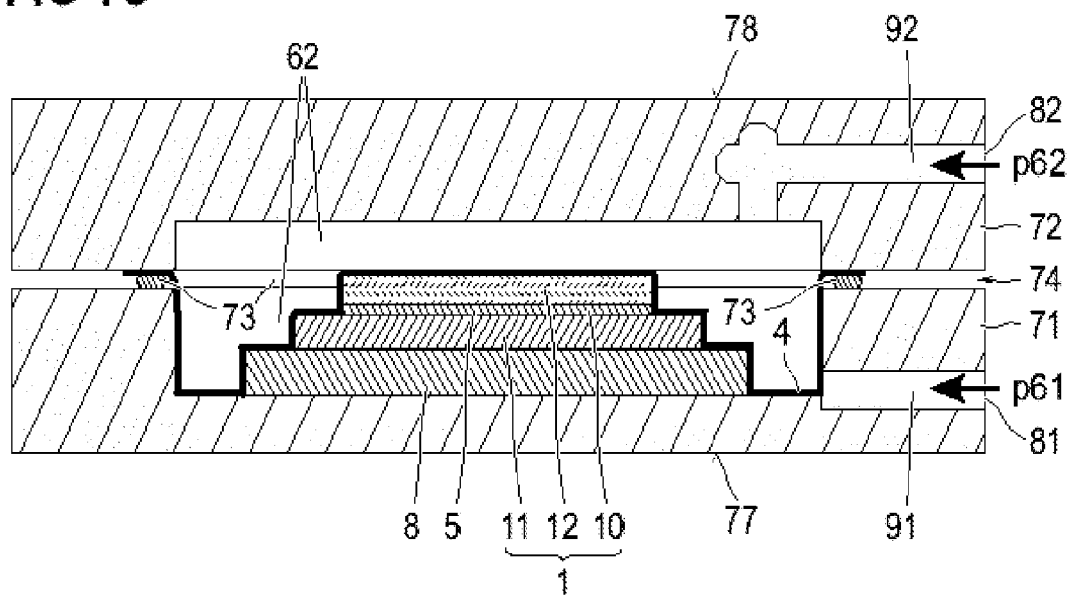
FIG. 1C shows the pressure chamber according to FIG. 1B after a second chamber region has been subjected to a second gas pressure.

The first gas pressure p61 and the second gas pressure p62 may, independently of one another, be a positive pressure or a negative pressure relative to the pressure of the atmosphere surrounding the pressure chamber 7. If pressures p61 and p62 are thus applied to the corresponding pressure connections 81 and 82, respectively, such that a differential pressure $\Delta p = p62 - p61$ is greater than zero, the film 4 comes to lie against the surface of the stack 1, as is shown in FIG. 1C, and substantially follows the surface profile thereof. The film 4 thereby seals off the gap between the first part 11 to be joined and the second part 12 to be joined, in which the connecting means 10 is located, in a gastight manner, so that the connecting means 10 is in a gastight region 5.

If, after the formation of the gastight region 5, the differential pressure $\Delta p$ is increased further, there is a compression of the remaining gas located in the gastight region 5 and the first part 11 to be joined and the second part 12 to be joined are pressed against one another. The connecting means 10 thereby comes to lie against the mutually facing sides of the parts 11, 12 to be joined and is also compressed. From the time when the gastight region forms, there are two effects that are of great importance for the further joining process:

Firstly, the two parts 11, 12 to be joined are pressed all the more strongly against one another the higher the pressure p62 is. In order to maintain the gastight region 5 reliably, the pressure p62 must be chosen to be greater than the pressure that is present in the gastight region 5 at the moment of sealing. Consequently, the force with which the two parts 11, 12 to be joined are pressed against one another can be set by way of the pressure p62. This can take place substantially irrespective of the pressure p61, as long as the secondary condition that p62 is greater than p61 is maintained, which is synonymous with saying that the differential pressure $\Delta p = p62 - p61$ is greater than zero. If, on the other hand, the pressure p61 were to exceed the pressure p62 by a specific amount, which is determined by the adhesive attachment of the film 4 to the stack 1 and the heating element 8, there would be the risk of the film 4 becoming detached from the stack 1 and the gastight region 5 not being maintained.

Secondly, the pressing force, and consequently the strength of the thermal contact, between the stack 1 and the heating element 8 can be set, and also the pressing force, and consequently the strength of the thermal contact, between the heating element 8 and the housing element 71, can be set by the differential pressure $\Delta p = p62 - p61$. These effects play a role during the heating up and cooling down of the stack 1.

In the case of this method, therefore, the pressure p62 acts on the parts 11, 12 to be joined and the connecting means 10. However, the force acting on the heating element 8 is determined by the differential pressure $\Delta p = p62 - p61$, that is to say by a pressure that is chosen to be much lower in practice than the maximum value of p62. As a result, the mechanical stresses occurring in the heating element 8 are also reduced, and as a consequence so is the risk of distortion or rupture.

For the initial heating up and/or the later further conditioning of the stack 1 with the aid of the heating element 8, it is advantageous if it is not cooled by the housing element 71, i.e. if there is a poor thermal contact between the heating element 8 and the housing element 71, which means that the $\Delta p = p62 - p61$ is set to a small positive value.

Although the thermal coupling between the stack 1 and the heating element 8 is thereby reduced, the heating rate remains sufficient on account of the small mass and thermal capacity of the stack 1.

As a result, the thermal coupling between the heating element 8 and the first housing element 71 is reduced, and as a consequence so is the heat dissipation of the heating element 8 through the first housing element 71 during the subsequent conditioning process, which facilitates the heating up of the stack 1. It is advantageous in this case if the heating element 8 has a low thermal capacity, so that it can be heated up quickly. However, the thermal capacity of the heating element 8 does not have to, but can, be chosen according to the type of parts 11, 12 to be joined of the stack 1. In the event that the stack 1 comprises a metallized ceramic substrate, but not a thick metal plate, as is used for example as a base plate for a semiconductor module, the thermal capacity of the stack 1—relative to the base area of the ceramic substrate—may for example lie in the range from $0.25 \text{ J/(K·cm}^2)$ to $1.4 \text{ J/(K·cm}^2)$. In this case, the thermal capacity of the heating element 8 relative to the base area of the ceramic substrate may, for example, lie in the range from $0.5 \text{ J/(K·cm}^2)$ to $5 \text{ J/(K·cm}^2)$, and the heat output of the heating element 8—likewise relative to the base area of the ceramic substrate—may for example lie in the range from $5 \text{ W/cm}^2$ to $50 \text{ W/cm}^2$. These value ranges may, in each case independently of one another, be used in the case of all the configurations of the invention. In the sense of the above definition, a "thick metal plate" is considered to be a metal plate of which the thickness is greater than or equal to 2.5 mm. Furthermore, the base area of a ceramic substrate is understood as meaning the area of the side with the largest surface area of the ceramic platelet of the ceramic substrate.

As can likewise be seen from FIG. 1C, the heating of the connecting means 10 takes place indirectly by way of that one of the two parts 11, 12 to be joined that is arranged between the heating element 8 and the other of the two parts 11, 12 to be joined.

If the connecting means 10 is a solder, the heat given off by the heating element 8 and/or the heating-up period are set such that the solder melts and a soldered connection is produced between the parts 11, 12 to be joined. In order to make soldering possible, each of the parts 11, 12 to be joined has a metallic surface on its side facing the other part to be joined, respectively.

Optionally, before the production of the gastight region 5, at least the pressure p61 and, likewise optionally, also p62 may be reduced by pumping evacuation shortly before, during or after the melting of the solder, in order to remove possible air inclusions from the solder to the greatest extent, and thereby achieve a soldering that is as free from voids as possible.

After the melting of the solder and the increasing of the differential pressure Δp for pressing the second part 12 to be joined against the first part 11 to be joined, the solder solidifies at a temperature T of the connecting means 10 that lies above the melting point of the solder, which is attributable to the fact that the liquid solder alloys with one or more metals from the metallization of one or both parts 11, 12 to be joined (diffusion soldering). For example, the solder may be a tin-containing solder, and the metallizations of the parts 11, 12 to be joined may respectively contain copper and/or silver or consist of copper and/or silver. After the melting of the solder, the copper and/or silver diffuses out of the metallizations into the solder and, together with the tin contained therein, forms one or more high-strength and high-melting intermetallic phases. Of these intermetallic phases, the intermetallic phase Cu6Sn5 has the lowest melting point, with 415° C., followed by the phases Ag3Sn, with 480° C., and Cu3Sn, with a melting point of 676° C.

After sufficient formation of solid bridges, continuously connecting the parts 11, 12 to be joined, in the connecting means 10, the latter is slowly cooled down further until it solidifies, so that a solid, durable material-bonding connection exists between the first part 11 to be joined and the second part 12 to be joined.

A solder, for example in the form of a thin preformed solder plate ("preform solder"), may be placed between the parts 11, 12 to be joined or be applied as a solder paste to one or both parts 11, 12 to be joined. The solder may also be applied as a thin surface layer to either one of the parts 11, 12 to be joined or to both parts 11, 12 to be joined. A preformed solder plate may, for example, have a thickness of less than or equal to 30 μm. The layer thickness of a solder layer applied to either one of the parts 11, 12 to be joined or the total thickness of the two solder layers applied to the parts 11, 12 to be joined may in this case be 5 μm to 30 μm, or for example 5 μm to 15 μm.

For cooling down, the heat supply from the heating element 8 to the stack 1 may be reduced or interrupted. In the simplest case, for this purpose the heating element 8 may simply be switched off. The heat of the two parts 11, 12 to be joined and of the connecting means 10 can then flow away via the heating element 8 to the first housing element 71. The first housing element 71 acts in this case as a heat sink. As an alternative to this, the heating operation of the heating element 8 may indeed be maintained, but slowly cut back, in order to keep down the thermomechanical stresses occurring before the heating element 8 is finally switched off.

Furthermore, for cooling down the stack 1, the differential pressure Δp=p62−p61 may be increased in comparison with the heating-up phase, so that the stack 1 and the heating element 8 are pressed against the housing element 71, which then acts as a heat sink.

If the connecting means 10 is a sinterable paste, a sinterable film, a sinterable layer applied to one or both parts 11, 12 to be joined and then dried, or an adhesive, the connecting means 10 is heated until it is sufficiently sintered or cured, so that a solid, material-bonded connection exists between the first part 11 to be joined and the second part 12 to be joined. A connecting means 10 formed as a sinterable film may, for example, be placed as a preformed ("green", i.e. unsintered) film plate between the parts 11, 12 to be joined. If the connecting means 10 is a sinterable paste or an adhesive, the connecting means 10 may be applied to one or both parts 11, 12 to be joined. The sinterable paste is preferably predried or presintered without pressure after being applied.

Irrespective of the type of connecting means 10, after the conditioning process the pressure chamber 7 is opened and the stack 1, in which then the first part 11 to be joined and the second part 12 to be joined are connected to one another solidly and with a material bond with the aid of the connecting means 10 located in between, is removed from the pressure chamber 7. A cooling-down phase following on from the conditioning process may then take place entirely or partially in the still closed pressure chamber 7, or else after the stack 1 has been removed from the pressure chamber 7.

In the case of this exemplary embodiment, as in the case of the other exemplary embodiments, the positions of the entry regions, at which the connecting lines 91 and 92 enter the interior space 6 of the pressure chamber 7, are merely represented schematically. The respective position may in principle vary, as long as it is ensured that the mode of operation described above can be realized. In order to avoid closing of these entry regions by the film 4 under unfavorable pressure conditions, the positions of the entry regions may be chosen according to the respective configuration. The entry region of the first connecting line 91 may also be designed such that it is formed underneath the heating element 8, running around the heating element 8, so that the edge of the lateral periphery of the heating element 8 that is facing the first housing element 71 is located freely in the entry region and does not rest on the housing element 71.

Figure 2:
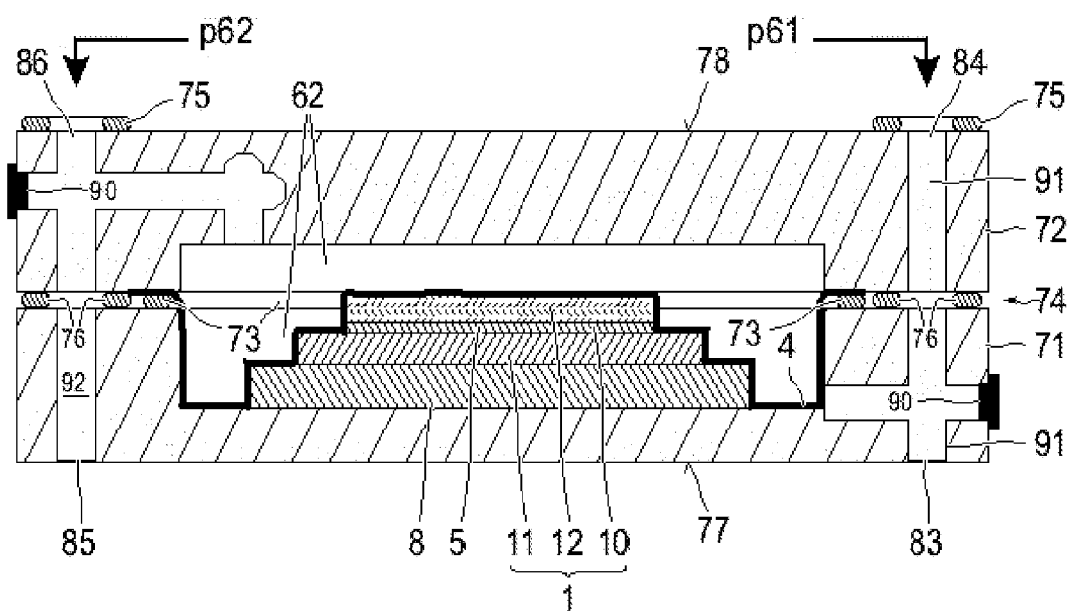
FIG. 2 shows a vertical section through a stackable pressure chamber.
Figure 3A:
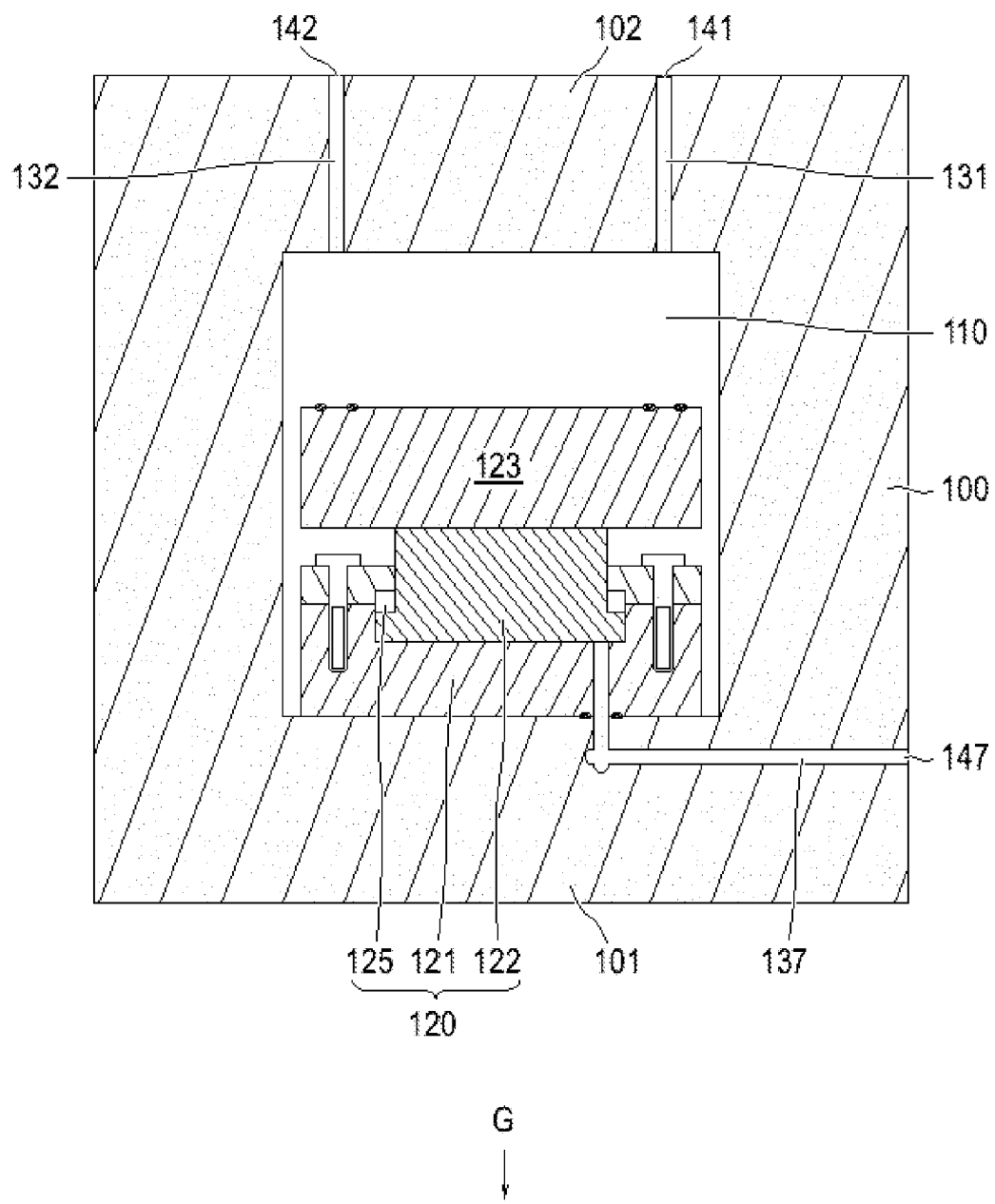
FIG. 3A shows a vertical section through a rigid holding frame to which a working cylinder is fastened.
Figure 3D:
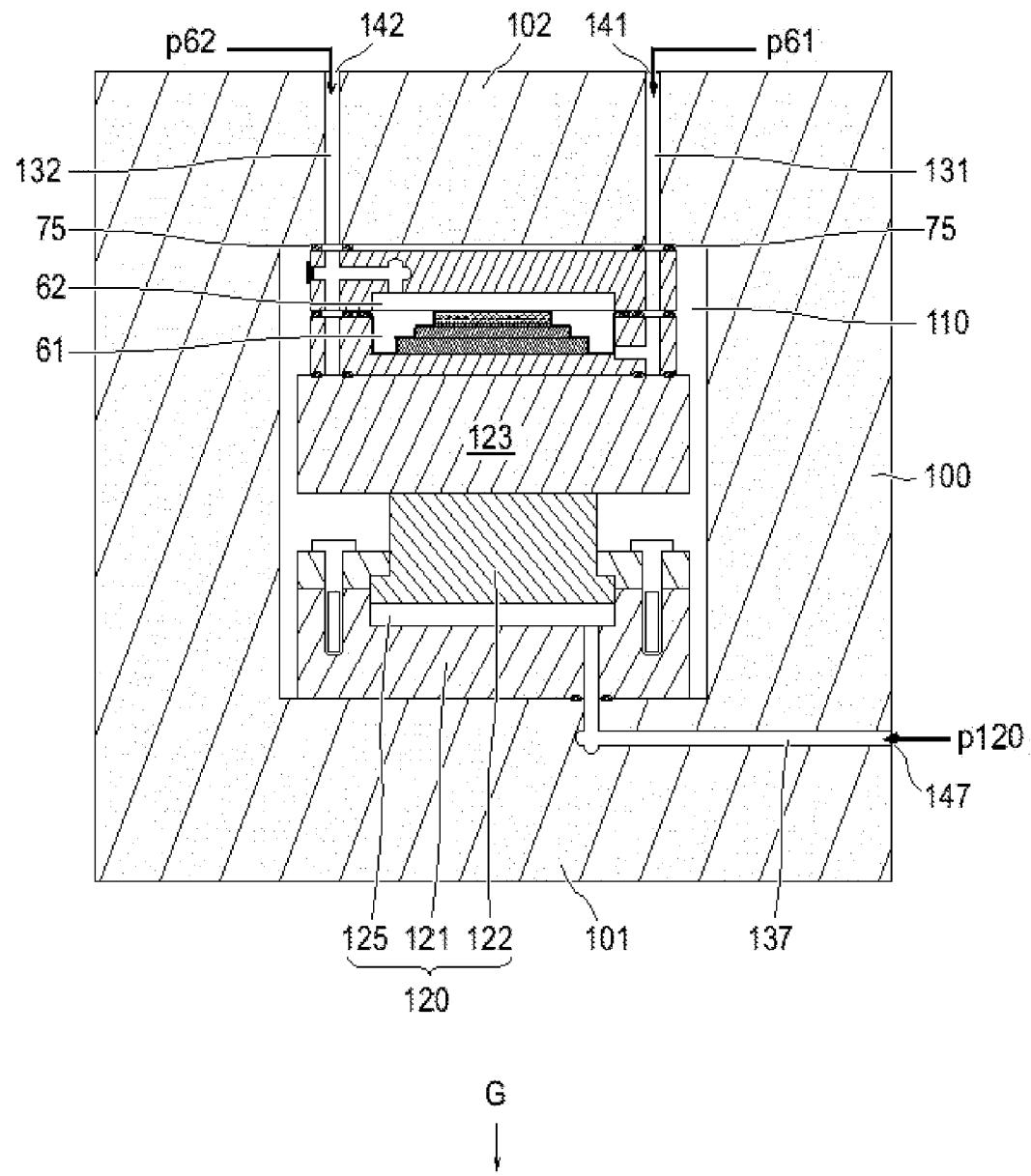
FIG. 3D shows a vertical section through the arrangement according to FIG. 3C after a second chamber region has been subjected to a second gas pressure.

The pressure chamber 7 shown in FIG. 2 differs from the pressure chamber 7 shown in FIGS. 1A to 1C in that it can be stacked with one or more further, identically or similarly constructed pressure chambers 7 in such a way that the pressures p61 and/or p62 in the stack can be passed on from pressure chamber 7 to pressure chamber 7. For this purpose, the pressure line 91, 92 concerned respectively runs between an entry opening 83 or 85 on the underside 77 of the pressure chamber 7 and an entry opening 84 or 86 on the upper side 78 of the pressure chamber 7, the entry openings 83 and 85 being formed on the first housing element 71 and the entry openings 84 and 86 being formed on the second housing element 72.

Each of the pressure lines 91, 92 is enclosed, at least at one of its entry openings 83, 84 or 85, 86 by an annular seal 75. These seals 75 ensure that the pressure line 71, 72 concerned can be coupled in a hermetically sealed manner to a corresponding pressure line 91, 92 of a further pressure chamber 7 stacked on the pressure chamber 7. Correspondingly, annular seals 76 provide hermetic sealing of the pressure lines 91 and 92 in the region between the housing elements 71 and 72.

The pressure lines 91, 92 may, for example, be realized with the aid of bores. If required, exposed bore openings may be closed in a hermetically sealed manner with the aid of a cover 90. For this purpose, the covers 90, optionally together with a seal, may be screwed into the bore opening. It is similarly possible to close the bore openings hermetically by welding the covers 90 onto the pressure chamber 7.

With a pressure chamber 7 formed according to FIG. 2, the joining process explained with reference to FIGS. 1A and 1C can be carried out in the same way. The same also applies correspondingly to a number of pressure chambers 7 formed according to FIG. 2 and stacked one on top of the other, which are respectively loaded with a first part 11 to be joined, a second part 12 to be joined, a connecting means 10 and a sealing means 4.

The principle of an apparatus by means of which the housing elements 71 and 72 of a pressure chamber 7 loaded with a stack 1 can be pressed against one another is now explained on the basis of FIGS. 3A to 3D. The apparatus comprises a holding frame 100, which encloses a receiving region 110 in an annular form. The holding frame 100 is rigidly formed and, as a result, has the mechanical stability that is required because of the high operating pressure. Also mounted on the holding frame 100 is a working cylinder 120 with a cylinder body 121 and a piston 122 that is movable in the latter. A working volume 125 of the working cylinder 120 may be subjected to a working pressure by way of a pressure line 137, in order to move the piston 122 from a lower position into an upper position. Optionally, the piston 122 may be provided with an adapter plate 123 at its upper end.

If, as shown in FIG. 3B, the piston 122 is in the lower position, a pressure chamber 7, which is formed and loaded as explained above with reference to FIG. 2, may be placed into the receiving region 110. For this purpose, the pressure chamber 7 is placed with its underside 77 onto the piston 122, or—if present—onto the adapter plate 123.

After that, the working volume 125 is subjected to a working pressure p120 by means of a gas or a liquid by way of the pressure line 137. The working pressure p120 is chosen such that the piston 122 moves upward, with the pressure chamber 7 located on it and the adapter plate 123, if there is one, so that the pressure chamber 7 located in the receiving region 110 is clamped between two legs 101 and 102 of the holding frame 100 and the first housing element 71 is pressed against the second housing element 72, the result of which is represented in FIG. 3C.

In this case, the seal 73 seals off the gap 74 between the housing elements 71 and 72 and thereby prevents a gas exchange between the interior space 6 of the closed pressure chamber 7 and the exterior of the pressure chamber 7 taking place through the gap 74. Optionally, the film 4 may also in this case be clamped between the housing elements 71 and 72, as shown.

Furthermore, in the clamped state described, the seals 75 (FIG. 2) provide gastight connections between the pressure line 91 (FIG. 2) and a pressure line 131, formed in the holding frame 100, and respectively between the pressure line 92 (FIG. 2) and a pressure line 132, formed in the holding frame 100. This makes it possible to subject the first chamber region 61 to a first gas pressure p61 by way of a pressure connection 141 and the pressure line 131 and 91 and to subject the second chamber region 62 to a second gas pressure p62 by way of a pressure connection 142 and the pressure line 132 and 92. The process and the effects thereby occurring are identical to the processes and effects already described on the basis of FIGS. 1A to 1C. The difference is that, in the case of the pressure chamber 7 shown in FIGS. 1A to 1C, the routing of the pressure lines 91 and 92 is chosen differently than in the case of the pressure chamber 7 shown in FIGS. 2 and 3A to 3D, which however is immaterial for the execution of the joining process taking place inside the pressure chamber 7, since all that matters is that the first gas pressure p61 can be fed to the first chamber region 61 and the second gas pressure p62 can be fed to the second chamber region 62.

After the application of a differential pressure $\Delta p = p62 - p61 > 0$, the film 4 comes to lie against the stack 1 and, as explained above, follows the surface contour thereof. When there is a sufficiently high differential pressure $\Delta p$, the heating element 8 is thereby pressed together with the stack 1 in the direction of the first housing element 71 by the differential pressure $\Delta p$ acting on the film 4.

After the film 4 has sealed off in a gastight manner the region 5, in which the connecting means 10 is located, and the connecting means 10 has been compressed by further increasing of the differential pressure $\Delta p$, the differential pressure $\Delta p$ can be reduced again to the extent that the heating element 8 is entirely or partially thermally decoupled from the first housing element 71.

In this state of being thermally decoupled from the housing element 71, the connecting means 10 can, together with the parts 11, 12 to be joined, be conditioned and compressed, pressed and sintered or soldered with the aid of the negative pressure in the reactor 7, as described above. In order to cool the stack 1 after the conditioning, the differential pressure $\Delta p$ may be increased again to a value at which the heating element 8 is pressed together with the stack 1 against the first housing element 71 on account of the differential pressure $\Delta p$ acting on the film 4, so that the stack 1 and the heating element 8 are in good thermal contact with the first housing element 71, which then acts as a heat sink. In order not to counteract the cooling, the heating element 8 may be switched off during the cooling operation.

In the case of a connecting means 10 formed as solder, the entire pressure chamber 7 may be initially evacuated to a very low absolute pressure of, for example, less than 50 hPa. Then, the differential pressure $\Delta p$ is increased by increasing the pressure p62 in the second chamber region 62 and by retaining the very low pressure p61 in the first chamber region 61, so that the film 4 is pressed against the stack 1. The very low pressure p61 has the effect of avoiding air inclusions in the later solder layer. The differential pressure $\Delta p = p62 - p61$ is in this case chosen to be of such a level that there forms a gastight region 5, in which the solder 10 is located. The differential pressure $\Delta p$ is then reduced to such an extent that the heating plate 8 is decoupled from the first housing element 71. After that, the heating element 8 is heated up and, at the latest when the solder has melted, the pressure p62 is increased, so that the parts to be soldered 11 and 12 are pressed against one another. At the same time, the pressure p61 may also be increased, so that a very small differential pressure $\Delta p$ remains, in order to avoid excessive thermal coupling between the heating element 8 and the first housing element 71. After the formation of sufficient intermetallic phases in the solder ("diffusion soldering"), cooling may be performed by increasing the differential pressure $\Delta p$, optionally after first switching off the heating element 8. In order to check and control the necessary temperature profiles of the connecting means 10, a temperature sensor that is thermally coupled to the connecting means 10 (not represented) may be used—as in the case of all possible configurations of the invention.

As an alternative or in addition to this, the maintaining of a specific variation over time of the temperature of the connecting means 10 may be set by executing the process in a specific way with specific time profiles of the heat output of the heating element 8, of the pressure p62 and, if provided, of the pressure p61, with test stacks 1 ("dummies") and making an assessment on the basis of the result achieved. Sufficiently good results may then be refined in the actual production process on the basis of an identical variation over time of the temperature and pressure. A prerequisite for this is that the test stacks 1 are identical, or at least comparable, to the stacks 1 that are processed in the actual production process.

In order to be able to establish the achieved maximum temperatures after the event, at least one of the parts 11, 12 to be joined or a dummy may be marked with an irreversible thermochromic ink, which assumes a specific color when a limiting temperature dependent on the ink concerned is reached and maintains this color even if the temperature of the part to be joined concerned goes below this limiting temperature again.

In order to set a defined variation of the cooling, the thermal coupling between the heating element 8 and the stack 1 on the one hand and the first housing element 71 on the other hand may be alternately increased or reduced, in that the differential pressure Δp is increased or reduced.

Figure 4:
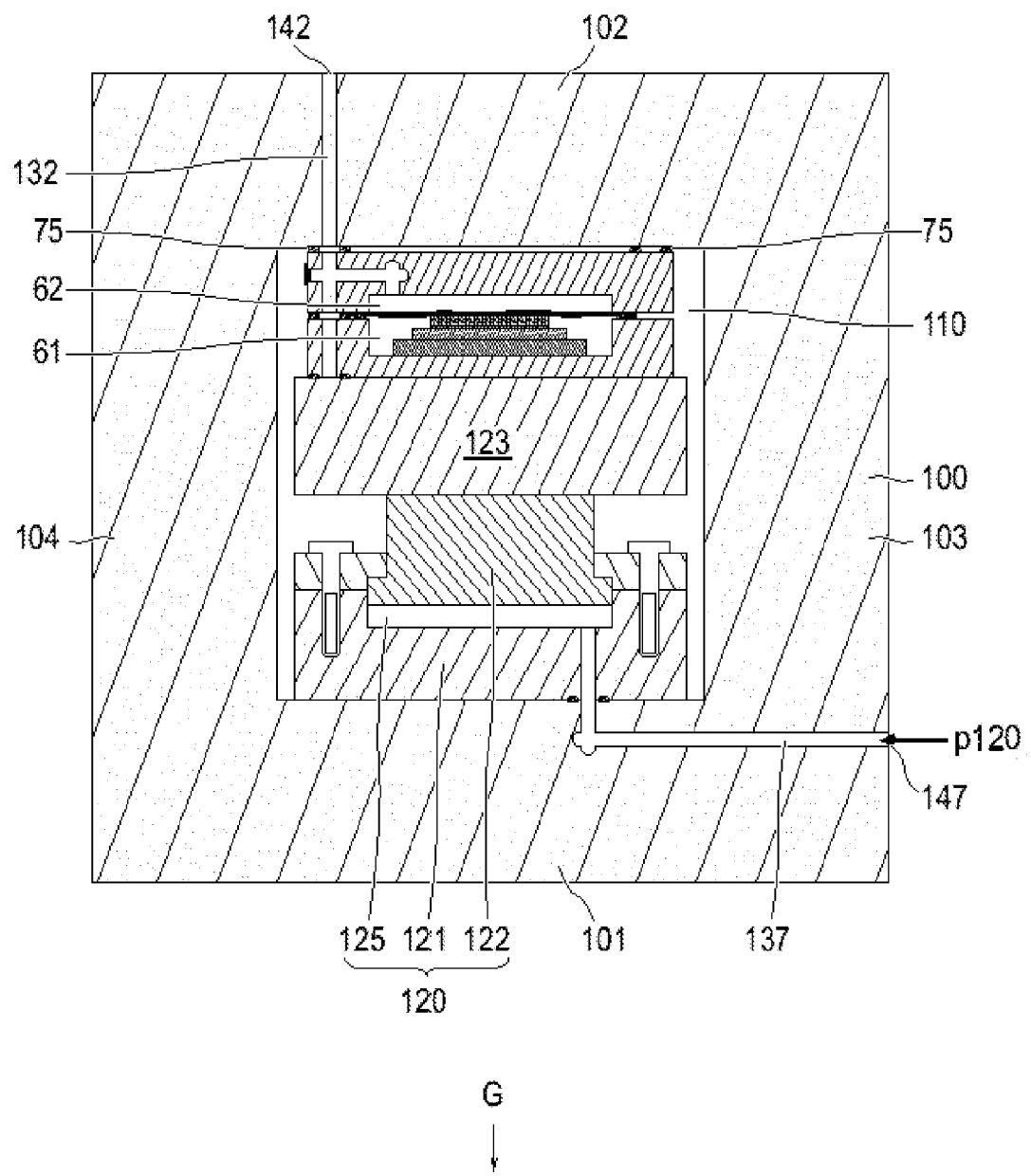
FIG. 4 shows an arrangement that differs from the arrangement according to FIG. 3D in that no pressure is fed to the first chamber region from the outside.

FIG. 4 shows a further configuration. This configuration differs from the configuration shown in FIG. 3C in that no pressure is fed to the first chamber region 61 from the outside with the pressure chamber 7 closed, i.e. when it is in the clamped state as explained above. In this case, a pressure p62, which is later fed to the second chamber region 62 by way of the pressure connection 142 and the pressure line 132, acts against the gas located in the first chamber region 61, the first chamber region 61 being hermetically sealed. Correspondingly, the holding frame 100 may also be designed without pressure connection 141 and without pressure line 131, as they are shown in FIG. 3C. However, there is also the possibility of providing such a pressure connection 141 and such a pressure line 131 and just not using them. Correspondingly, the pressure chamber 7 may also be designed without the pressure line 91 shown in FIG. 2. As an alternative to this, a pressure chamber 7 may also have such a pressure line 91, if it is closed during the joining process.

Figure 5B:
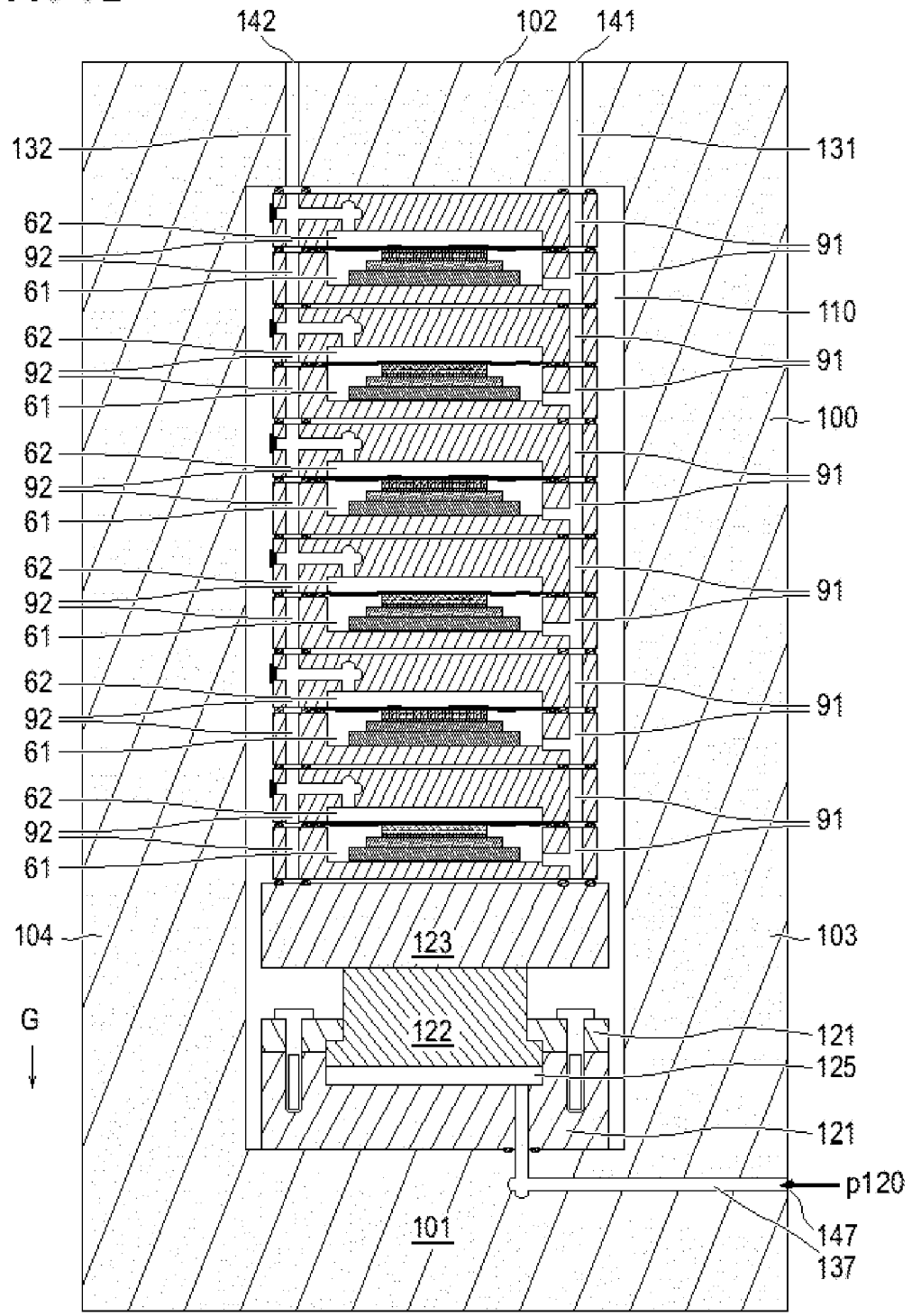
FIG. 5B shows a vertical section through the arrangement according to FIG. 5A after actuation of the working cylinder.

A pressure chamber 7, such as that shown for example in FIG. 2, may also be formed for the purpose that it can be stacked with one or more pressure chambers 7 constructed identically to it or similarly to it such that the stack can be arranged in a receiving region 110 of a holding frame 100, as is represented by way of example in FIG. 5A. The stack located in the receiving region 110 may, as shown in FIG. 5B, be clamped there with the aid of a working cylinder in such a way that all the pressure chambers 7 of the stack are pressed against one another in the stacking direction and that furthermore, in the case of each of these pressure chambers 7, the first housing element 71 and the second housing element 72 thereof are pressed against one another, the result of which is shown in FIG. 5B. For actuating the working cylinder, the working volume 125 thereof is subjected to a working pressure p120 by means of a gas or a liquid by way of the pressure line 137. The working pressure p120 is chosen such that the piston 122 moves upward, with the stack of pressure chambers 7 and the optional adapter plate 123 located on it, and the stack located in the receiving region 110 is clamped between two legs 101 and 102 of the holding frame 100.

The stacking and pressing against one another of the pressure chambers 7 has the effect that the pressure lines 92 thereof (see FIG. 2) are pneumatically connected in series within the stack, so that a pneumatic or hydraulic pressure p62, which is fed into a pressure line 132 that is integrated in the holding frame 110 by way of a pressure connection 142, is passed on from pressure chamber 7 to pressure chamber 7 by way of the respective pressure lines 92 of the pressure chambers 7. Here, the pressure lines 92 of neighboring pressure chambers 7 are respectively sealed off by means of a seal 75 (see also FIG. 2) located between these pressure chambers 7.

Correspondingly, the stacking and pressing against one another of the pressure chambers 7 also has the effect that the optional pressure lines 91 thereof (see FIG. 2) are pneumatically connected in series within the stack, so that a pneumatic or hydraulic pressure p61, which is fed into a pressure line 131 that is integrated in the holding frame 110 by way of a pressure connection 141, is passed on from pressure chamber 7 to pressure chamber 7 by way of the respective pressure lines 91 of the pressure chambers 7. Here, the pressure lines 91 of neighboring pressure chambers 7 are respectively sealed off by means of a seal 75 (see also FIG. 2) located between these pressure chambers 7.

The seals 75 on the upper side 78 of the uppermost pressure chamber 7 of the stack serve the purpose of connecting the pressure line 92 thereof and the optional pressure line 91 thereof in a hermetically sealed manner to the pressure lines 142 and 141, respectively.

Respectively arranged between the pressure line 92 of the lowermost pressure chamber 7 of the stack and the adapter plate 123 as well as between the optional pressure line 91 of the lowermost pressure chamber 7 of the stack and the adapter plate 123 is a seal 79, with which the lower ends of the pressure lines 92 and 91, respectively, are closed in a hermetically sealed manner in the clamped state of the stack.

The further joining process in the individual pressure chambers 7 of the stack can then take place as explained above with reference to FIGS. 1A to 1C and 2 for individual pressure chambers 7. FIG. 5C shows the arrangement after applying the pressures p61 and p62 to the pressure connections 141 and 142, respectively, with a pressure differential Δp=p62−p61 greater than zero, so that in the individual pressure chambers 7 the film 4 comes to lie against the parts 11, 12 to be joined and also the optional heating element 8, as is shown in FIG. 2 for a single pressure chamber 7.

Figure 6:
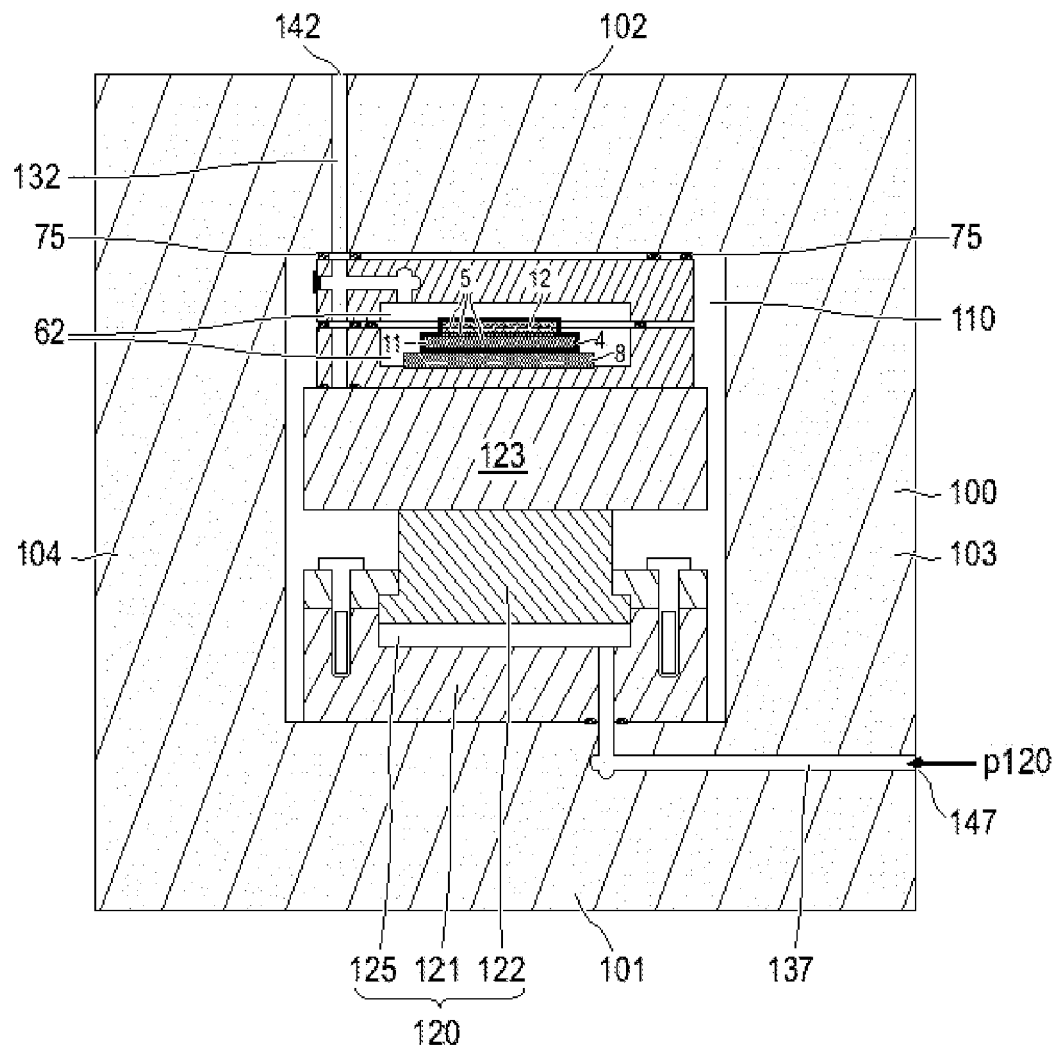
FIG. 6 shows a vertical section through an arrangement that differs from the arrangement according to FIG. 4 in that the film is formed as a bag which is closed in a gastight manner and in which the two parts to be joined and the connecting means are arranged.

In the case of a further configuration that is shown in FIG. 6, the sealing means 4 is likewise formed as a film 4, but is not clamped between the first housing element 71 and the second housing element 72 as in the case of the previously shown variants. Instead, the film 4 is formed as a gastight, closed bag, in which the first part 11 to be joined, the second part 12 to be joined and the connecting means 10 located between these parts 11, 12 are arranged stacked one on top of the other. Optionally, the bag 4 with the placed-in stack 1 may be evacuated before it is placed into the pressure chamber 7 and sealed in a gastight manner in the evacuated state. Consequently, also in the case of this configuration, the connecting means 10 is located in a gastight region 5, which is provided by the interior of the bag 4.

If, after the closing of the reactor 7, the second chamber region 62 is subjected to an absolute pressure p62, which is higher than the ambient pressure of the arrangement, by way of the pressure connection 142 and the pressure line 132, the parts 11, 12 to be joined are pressed against the connecting means 10 located between them. Here, the connecting means 10 is compressed and also comes to lie against the mutually facing sides of the parts 11, 12 to be joined.

After that, the connecting means 10 may, as explained above, be heated up and conditioned with the aid of the heating element 8. Here, too, the connecting means may, for example, be a solder, a sinterable paste or an adhesive. Unlike in the case of the previously explained configurations, changing of the pressure p62 does not bring about any change of the thermal coupling between the heating element 8 and the first housing element 71 of the pressure chamber 7, since the filled film bag 4 merely rests on the heating element 8.

Rather, in the case of this configuration, a specific temperature profile to be maintained during the conditioning operation and the subsequent cooling down process is controlled substantially by the regulation of the heat output of the heating element 8, it also being possible for the heating element 8 to be switched off or repeatedly switched alternately off and on. The heating element 8 is continuously in sufficiently good thermal contact with the first housing element 71; it may in particular be solidly connected to the first housing element 71.

The method explained on the basis of FIG. 6 can also be realized with a number of stacked pressure chambers 7, it only being necessary to adapt the dimensions of the holding frame 100 to the number of pressure chambers 7 to be processed in a stacked state.

Figure 7:
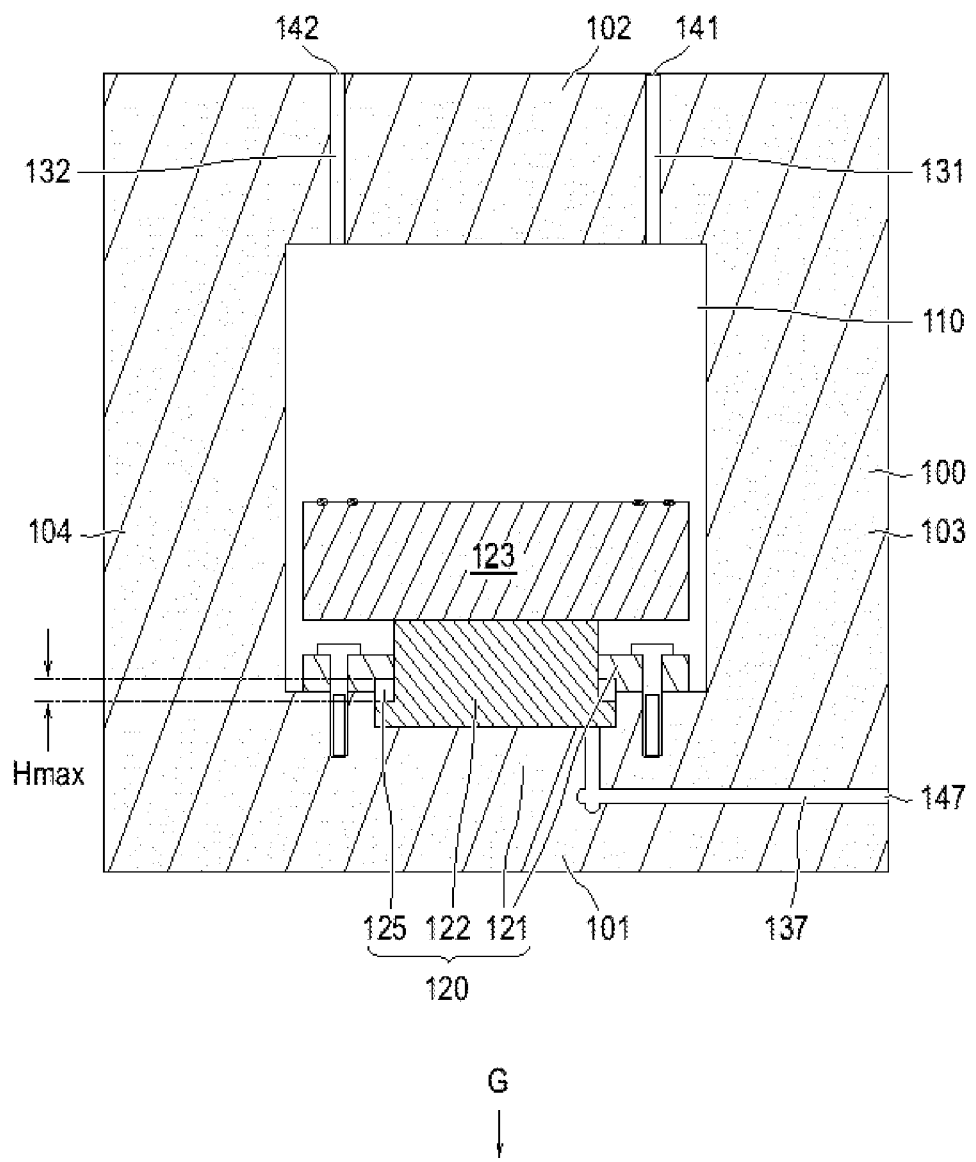
FIG. 7 shows a vertical section through a holding frame with an integrated working cylinder.

According to a further configuration that is shown in FIG. 7, a working cylinder 120 may also be integrated in a holding frame 100. This variant can be realized in the case of all the holding frames 100. For this purpose, at least part of the holding frame 100 acts as a cylinder body 121.

Here, as in the case of all the other variants of the invention, the piston 122 of the working cylinder 120 may have parallel to the direction of gravitational force G a maximum possible stroke Hmax of less than or equal to 5 mm, less than or equal to 1 mm or less than or equal to 0.2 mm, to be precise irrespective of whether or not the working cylinder 120 is integrated in the holding frame 100.

In principle, the invention can be realized in all variants with the aid of a holding frame 100, which is rigidly formed and as a result has a high strength. In order to achieve a particularly high strength, the holding frame 100 may in this case be formed as an annularly closed frame, which surrounds the receiving region 110 in an annular form.

Figure 8:
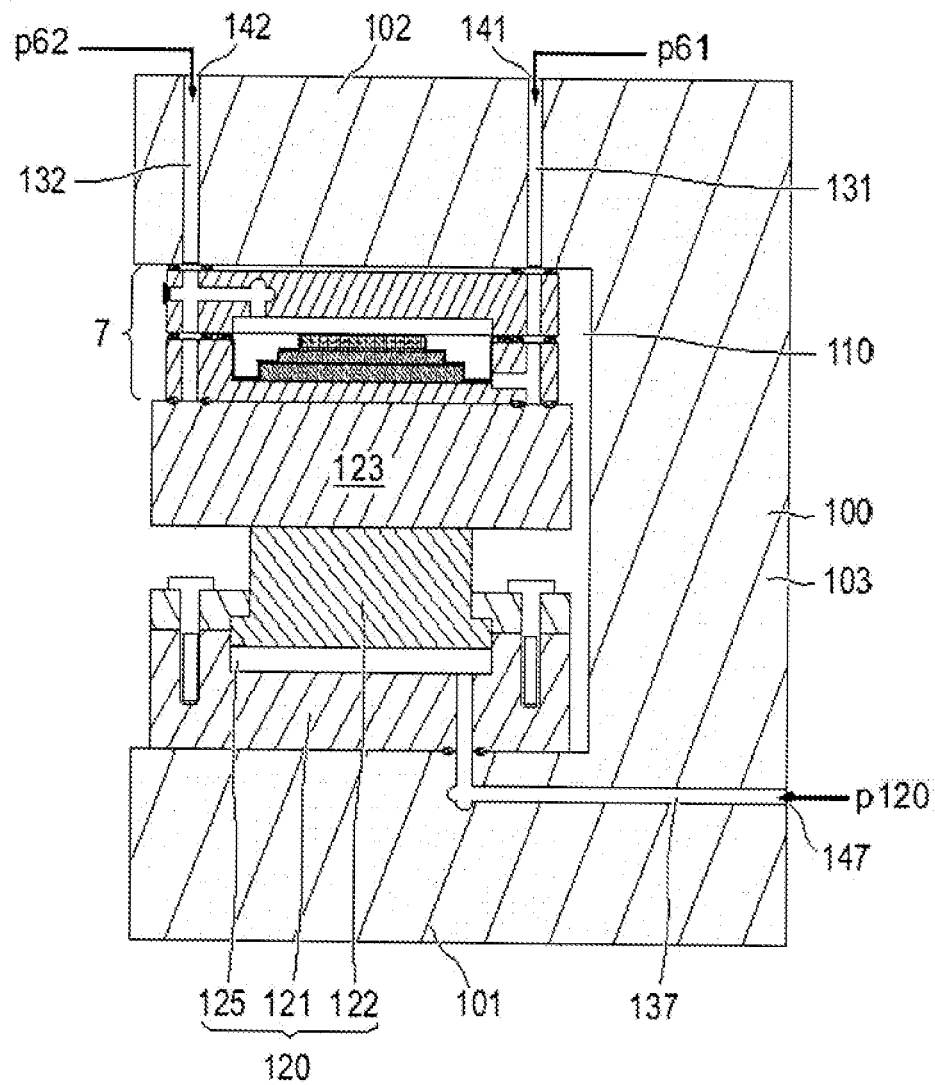
FIG. 8 shows a vertical section through an arrangement that differs from the arrangement according to FIG. 3B in that the holding frame is not formed as a closed ring.

However, it is similarly possible that a holding frame 100 is not closed in an annular form. FIG. 8 shows an example of this. Apart from the different construction of the holding frame 100, this arrangement is identical to the arrangement according to FIG. 3D. The joining process can also take place in exactly the same way as described with reference to FIGS. 3A to 3D.

Figure 9:
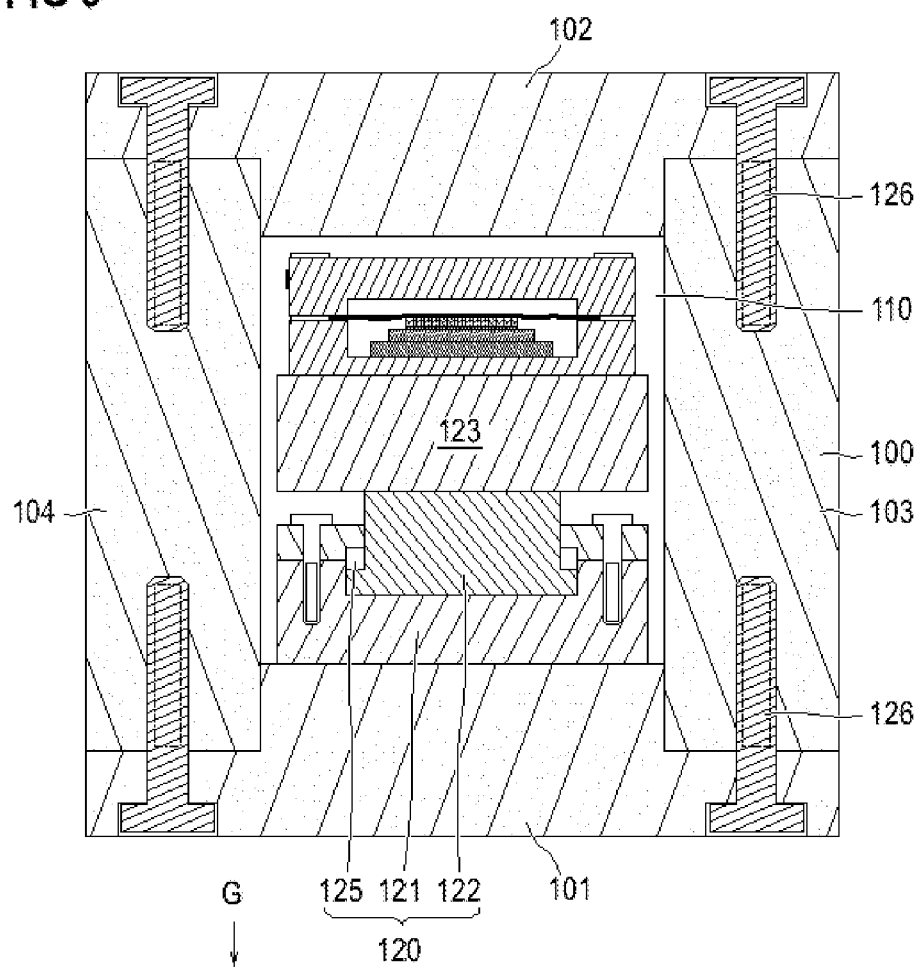
FIG. 9 shows an arrangement that differs from the arrangement according to FIG. 3B in that the holding frame is formed from a number of elements rigidly connected to one another.

Irrespective of whether or not a holding frame 100 is formed as closed in an annular form, it may either consist of a single part, as has already been shown in all of the previous figures, or else consist of two or more parts that are solidly connected to one another, which is shown by way of example in FIG. 9 on the basis of four legs 101, 102, 103, 104 of the holding frame 100 that are solidly connected to one another. The connection of the legs 101, 102, 103, 104 may, for example, take place with the aid of screws 126. Alternatively or additionally, however, the legs 101, 102, 103, 104 may also be solidly connected to one another in any other way desired, for example by welding.

Apart from the multipart configuration of the holding frame 100, this arrangement is identical to the arrangement according to FIG. 3B. As a difference from FIG. 3B, however, a different sectional plane is represented, in order to show the screws 126.

The previously explained possible configurations of a holding frame 100 can be used in any way desired with all of the other variants of the invention.

In FIGS. 10A to 10D, some more variants of holding frames 100 are shown by way of example. For ease of illustration, pressure connections 141, 142 and 147 are not represented, but they may in principle be present.

Figures 10A, 10B, 10C, 10D:
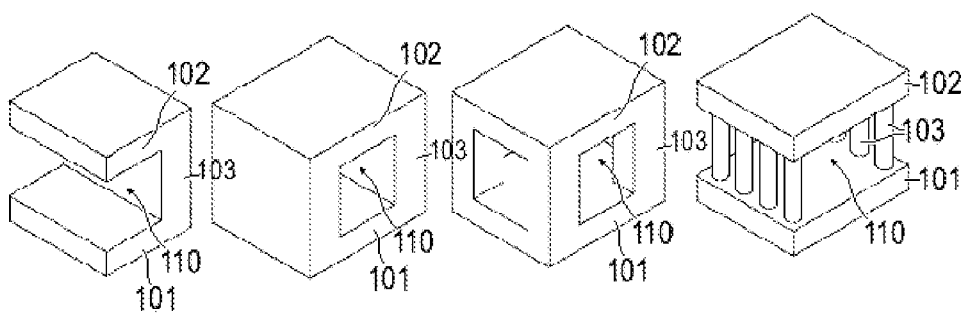
FIGS. 10A-10D show perspective views of various holding frames.

The construction of the holding frame 100 according to FIG. 10A corresponds to the construction of the holding frame 100 shown in FIG. 8. The receiving region 110 is located here between the opposing legs 101 and 102 of the holding frame 100.

Similar to the holding frames 10 shown in FIGS. 1A to 1C, 2, 3A to 3D, 4, 5A to 5D, 6 and 7, the holding frame 100 shown in FIG. 10B is configured as a one-part closed ring, which encloses the receiving region 110.

The holding frame 100 according to FIG. 10C has two opposing, substantially rectangular legs 101 and 102, which are connected to one another by four connecting portions 103. The connecting portions 103 thereby respectively connect two corner regions, lying one above the other, of the legs 101 and 102. The holding frame 100 that is shown is formed as one part, but it could also consist of a number of legs 101, 102, 103 that are solidly connected to one another, for example screwed to one another or welded to one another. However, the number of connecting legs 103 is not restricted to four. Rather, less than or more than four connecting legs 103 may also be used. Generally, however, not all of the connecting legs 103 connect corner regions respectively lying one above the other of the legs 101 and 102. It is also possible and advantageous, but not absolutely necessary, to connect all of the corner regions lying one above the other of the legs 101 and 102 by one connecting leg 103.

The description for FIG. 10C also applies correspondingly to the holding frame 100 according to FIG. 10D, with the particular feature that the connecting portions 103 are arranged in two parallel rows, each of which runs between two edges lying one above the other of the legs 101 and 102.

As shown in all of the previous FIGS. 1A to 1C, 2, 3A to 3D, 4, 5A to 5D and 6 to 9, the working cylinder 120 in the case of all the configurations of the invention may be located below the receiving region 110 in the direction of gravitational force, so that, after completion of the joining process, taking away the working pressure p120 has the effect that the piston 122 moves downward on account of its own weight and on account of the pressure chamber 7 placed on it or the stack of pressure chambers 7 placed on it, and the pressure chamber 7 or the stack of pressure chambers 7 can be removed from the receiving region 110.

If, in a variant of the invention that is otherwise as desired, a pressure line of a pressure chamber 7 placed in a receiving region 110 is connected pneumatically in series with a specific pressure line integrated in the holding frame 100, and/or if a pressure line of a pressure chamber 7 is connected pneumatically in series with a pressure line of another pressure chamber 7 stacked on the pressure chamber 7, sufficiently exact positioning of the respective pressure chamber 7 in the receiving region 110 or sufficiently exact relative positioning of the pressure chambers 7 stacked one on top of the other is required. For this purpose, the pressure chambers 7 respectively to be positioned in relation to one another or the holding frame 100 may be equipped with any desired positioning aids. For example, positioning projections on the one element that engage in positioning recesses of the other element may be used for this purpose.

For all of the previously explained examples, a first and a second part 11, 12 to be joined were connected using a connecting means 10 located between them, the first part 11 to be joined, the connecting means 10 and the second part 12 to be joined being arranged one on top of the other to form a stack 1.

The first part 11 to be joined may, for example, be a metal base plate for a semiconductor module, and the second part 12 to be joined may be a leadframe. Similarly, the first part 11 to be joined may, for example, be a leadframe and the second part 12 to be joined may be a semiconductor chip. In the case of all of these variants, the leadframe may be formed as a ceramic platelet, which on opposite main faces is respectively coated with a metallization layer. In this case, at least one of the metallizations may have an interconnect structure.

Furthermore, in the case of all the explained methods of the invention, a stack 1 may comprise not only two but also three or more parts to be joined that are to be connected to one another and a corresponding number of connecting means. Thus, the stack may, for example, have as a part to be joined a base plate for a semiconductor module, a leadframe as explained above and a semiconductor chip, which are stacked one on top of the other, so that the leadframe is located between the base plate and the semiconductor chip. In the preparation for the joining process, such a stack 1 is placed into the pressure chamber 7 and positioned together with it in the receiving region 110 of a holding frame 100 such that the base plate is at the bottom in the direction of gravitational force, i.e. on the side of the stack 1 that is facing the working cylinder 120.

Irrespective of how the holding frame 100 is otherwise configured, it may be designed in such a way that it withstands an absolute pressure p120 of the working cylinder 120 of 300 bar when the latter clamps the pressure chamber or chambers 7 located on it in the holding frame 100.

FIG. 11 shows a plan view of a housing element 71 of a pressure chamber 7, placed in the interior space 6 of which is a stack 1, which comprises a metal base plate 11 for a semiconductor module, a number of ceramic leadframes 12 metallized on two sides, as explained, and a number of semiconductor chips 13. The leadframes 12 are placed on the base plate 11, a first connecting means (concealed) being located between each leadframe 12 and the base plate 11. Also placed on each of the leadframes 12 is at least one semiconductor chip 13, a second connecting means (concealed) being located between each of the semiconductor chips 13 and the leadframe 12 concerned. Placed over the stack 1 is a sealing means 4, which is formed as a film, conceals the base plate 11, the leadframes 12 and the semiconductor chips 13 and extends to over the seal 73, for which reason the components located under the film and concealed by it, the base plate 11, the leadframes 12 and the semiconductor chips 13, are represented by dashed lines. The semiconductor chips 13 are in this case located on the side of the leadframes 12 that is facing away from the base plate 11. There are not yet any solid connections between the base plate 11 and the leadframes 12 as well as between the leadframes 12 and the semiconductor chips 13. These are only established after the closing of the pressure chamber 7 in the course of any one of the previously described joining processes and using any one of the previously described pressure chambers 7 as well as using any one of the previously described holding frames 100, the respectively shown stack 1 having to be replaced by the stack 1 shown in FIG. 11.

With a finished joined stack 1, which for example comprises at least one base plate 11 and a leadframe 12 connected to it with a material bond, or which comprises at least one leadframe 12 and a semiconductor chip 13 connected to it with a material bond, or which comprises at least one base plate 11, a ceramic platelet 12 connected to the base plate 11 with a material bond and a semiconductor chip 13 connected to the ceramic platelet 12 with a material bond, a semiconductor module can be produced.

FIG. 12 shows an example of such a semiconductor module 200. In the case of this module, after the joining process the stack 1 is electrically contacted with one or more electrically conducting contact elements 202 and arranged in a housing 201. The leadframe 12 in this case comprises a ceramic platelet 12a, which is coated on opposite main faces (i.e. the two sides of the ceramic platelet 12a with the largest surface areas) with metallization layers 12b and 12t. A first connecting means 10 is arranged between the base plate 11 and the leadframe 12; a second connecting means 20 is arranged between the leadframe 12 and the semiconductor chip 13.

In FIGS. 13 and 14, two examples of a relative variation over time of the pressures p61 and p62 as well as of the temperature of the connecting means 10 during one of the previously described joining processes are now explained. The connecting means 10 may in this case consist of an adhesive, or of a sinterable material, which is sintered during the joining process.

The upper curve respectively shows the variation of the differential pressure $\Delta p = p62 - p61$, the middle curve the variation of p62, and the lower curve the variation of the temperature T of the heating element 8. The pressures p61 and p62 are in each case absolute pressures. The examples can be used in the case of all the configurations in which the interior space 6 of the pressure chamber 7 is divided by a sealing means 4, formed as a film, into two chamber regions 61 and 62, between which the film prevents a gas exchange. In the case of the configurations in which there is only one chamber region 62 that can be subjected uniformly to pressure, only the explained variations over time of the pressure p62 and of the temperature T of the single or plural connecting means 10, 22 apply. The upper curve with the variation of a differential pressure is not relevant in this case.

In the case of the first example according to FIG. 11, after the closing of the pressure chamber 7, a differential pressure $\Delta p = p62 - p61$ is generated in a first time interval I with a temperature increased somewhat (with respect to room temperature). This brings about the effect that the film 4 becomes soft and thereby comes to lie against the surface of a stack 1 located in the pressure chamber 7, so that a gastight region 5 is produced. Furthermore, the heating element 8 is preheated. In the time interval I, the differential pressure $\Delta p$ reaches a maximum value of $\Delta pImax$, which is at least 20 bar and which may, for example in the case of sintering, lie in the range from 80 to 400 bar or, in the case of adhesive bonding, lie in the range from 20 to 50 bar.

After that, the pressure p62 and the temperature T are increased in a second time interval II to a value p62max and Tmax, respectively, in order to press the parts 11, 12 to be joined and the connecting means 10 arranged between them against one another and (except in the case of the configurations in which there is only one chamber region 62 that can be subjected uniformly to pressure) establish a good thermal contact between the stack 1 and the heating element 8. In this case, the value Tmax is chosen such that it is sufficient to cure the connecting means 10 in the case of an adhesive or sinter the connecting means 10 in the case of a sinterable material.

After the stack 1 has been sufficiently conditioned in the time interval II, the stack 1, and as a consequence the connecting means 10, are cooled down. For this purpose, the differential pressure $\Delta p = p62 - p61$ may be increased once again, in order to increase the thermal coupling between the stack 1 and the housing element 71 acting as a heat sink (except in the case of the configurations in which there is only one chamber region 62 that can be subjected uniformly to pressure).

Figure 15:
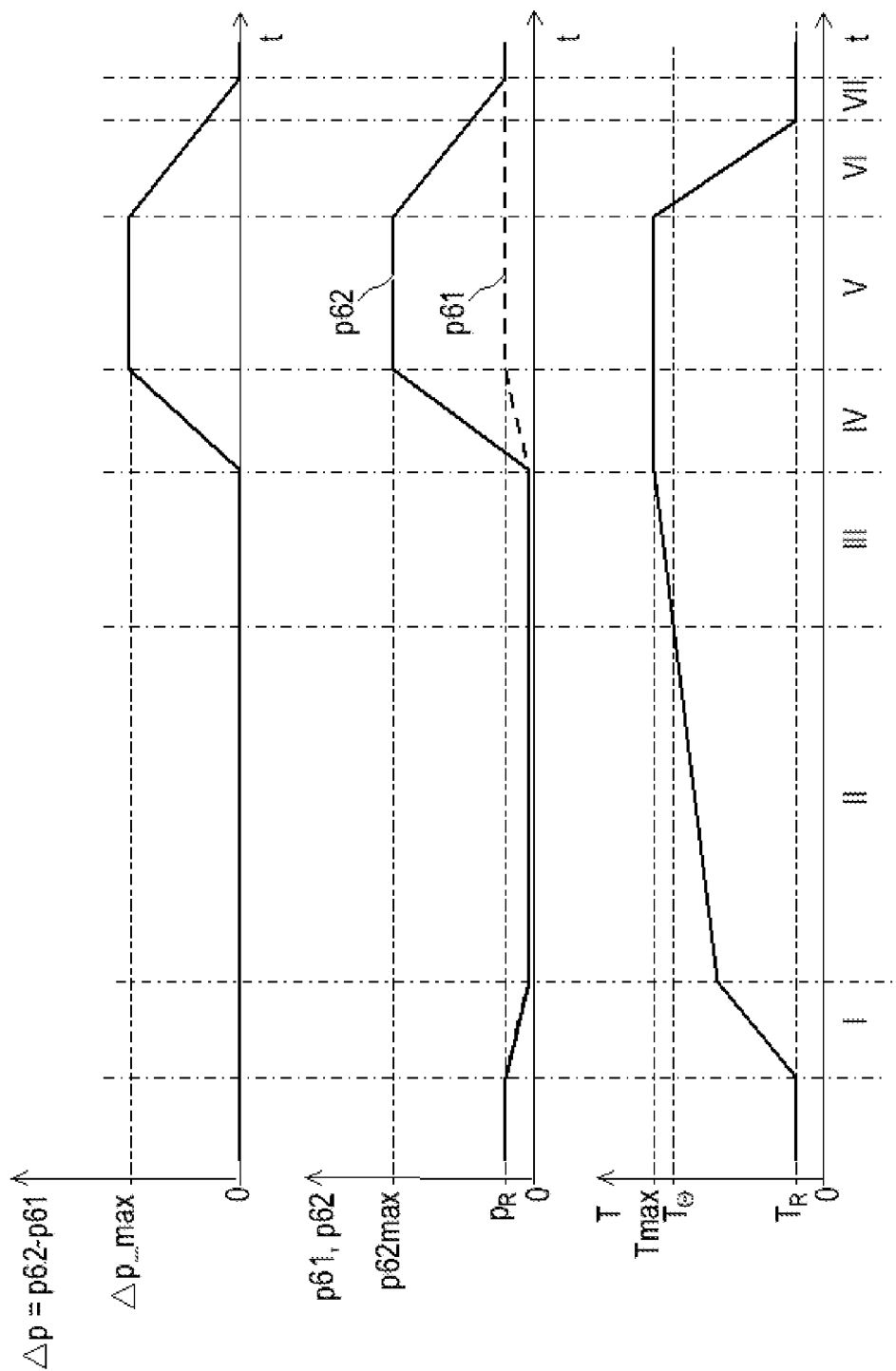
FIGS. 15-16 show various examples of possible variations over time of the first and second pressures and of the temperature of the connecting means during a joining process with a connecting means formed as a solder.

The example according to FIG. 12 initially shows a first time segment I, which is identical to the time segment I according to FIG. 15 and in which the same processes are executed. After there has formed a sealed-off region 5, in which the connecting means 10 is located, the differential pressure $\Delta p$ may fall, while the pressure p62 is increased further in a time interval II'. During a subsequent time interval II", the temperature T is then also increased. The temperature rise therefore takes place with a delay with respect to the rise in the pressure p62. As a result, during the sintering, the connecting means 10 is initially strongly compressed (beginning in the segment II' and maintained in the segment II"). In the segment II", the adhesive bonding or the sintering is completed on account of the high temperature T. In the case of a sintered connection, consequently a high density of the sintered material is achieved, which is advantageous with regard to the strength of the sintered connection and also with regard to the thermal coupling between the parts 11, 12 to be joined.

Generally, it is important specifically in the production of sintered connections, that is to say when the connecting means 10 consists of any desired sinterable material, that the maximum value of the pressure p62 that is required for the sintering process is reached before the temperature T is raised to the temperature at which the connecting means 10 sinters. Otherwise, in particular in the case of sintering materials with a nanostructure, there would be the risk of premature sintering, which would lead to the formation of a highly porous structure, which would also no longer allow itself to be compressed.

In the case of the production of sintered connections, the temperature Tmax may, for example, be at most 280°, or at most 260°. Irrespective of that, the maximum pressure p62max may be at least 50 bar, at least 80 bar or at least 150 bar. Furthermore, irrespective of Tmax and irrespective of its minimum value, the maximum pressure p62max may be at most 300 bar or at most 500 bar.

Otherwise, in the case of all the configurations of the invention, that is to say not only in the case of the production of sintered connections, the pressure p61 (if provided in the case of the pressure chambers 7 or holding frame 100 concerned), the pressure p62 and the temperature T may be set independently of one another.

Figure 16:
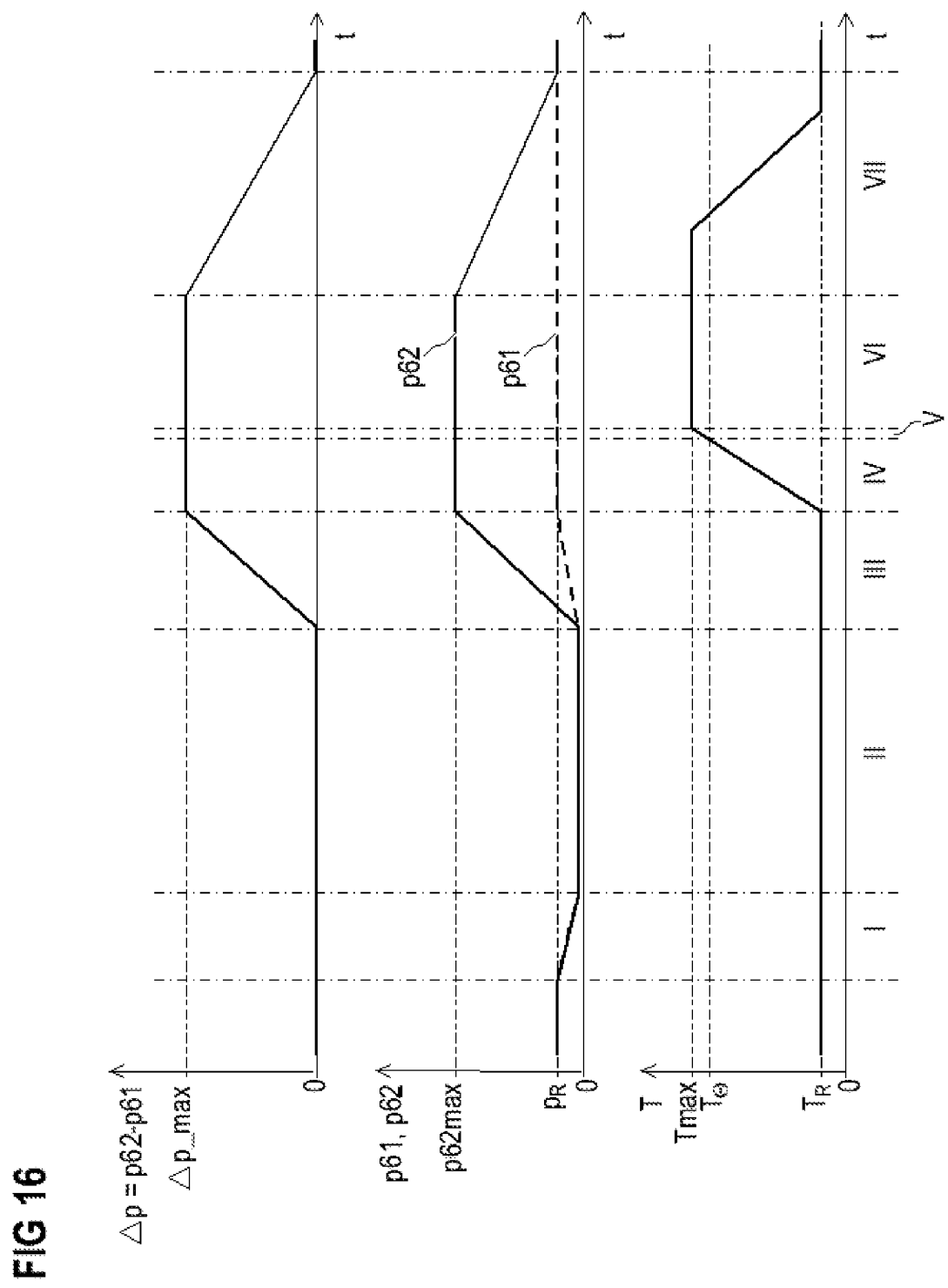

In FIGS. 15 and 16, two examples are now explained of a relative variation over time of pressure and temperature during one of the previously described diffusion soldering processes, in which the connecting means 10 consists of a solder that is heated during the joining process to above its melting point $T_\ominus$, and thereby melted, and is then cooled down. The upper curve respectively shows the variation of the differential pressure $\Delta p = p62 - p61$, the middle curve the variation of p62, and the lower curve the variation of the temperature T of the connecting means 10. The pressures p61 and p62 are absolute pressures. The examples can be used in the case of all the configurations in which the interior space 6 of the pressure chamber 7 is divided by a sealing means 4, formed as a film, into two chamber regions 61 and 62, between which the film prevents a gas exchange. In the case of the configurations in which there is only one chamber region 62 that can be subjected uniformly to pressure, only the explained variations over time of the pressure p62 and of the temperature T of the connecting means 10, 22 apply. The upper curve with the variation of a differential pressure is not relevant in these cases.

In the case of the example according to FIG. 15, the closed pressure chamber 7 (in the case of two chamber regions 61 and 62, both chamber regions 61, 62) is (are) initially at normal pressure $p_R$, i.e. at the room pressure surrounding the pressure chamber 7. Then, the interior space 6 (or both chamber regions 61, 62) is (are) evacuated to a very low absolute pressure, for example less than 50 hPa, so that in the case of two chamber regions 61, 62 the differential pressure $\Delta p = p62 - p61$ is equal to zero. The evacuation of the first chamber region 61 brings about the effect that, during the subsequent melting of the solder in the interval III, possible air inclusions can escape from the connecting means 10, in order to achieve a soldering that is as free from voids as possible. Furthermore, in the interval I, the temperature T of the connecting means 10 is increased from room temperature $T_R$ to a temperature that is lower than the melting point $T_\ominus$ of the connecting means 10. This facilitates the heating up of the stack 1 with the connecting means 10 and the parts 11, 12 to be joined, because there is only a slight thermal coupling between the stack 1 and the housing element 71 on account of the differential pressure of $\Delta p$ equal to zero.

In a subsequent interval II, the temperature T is increased further at a heating-up rate that is lower than the heating-up rate in the interval I, until at the end of the interval II the melting point $T_\ominus$ of the connecting means 10 is reached, so that the latter liquefies. From reaching the melting point $T_\ominus$, possible air inclusions can escape from the solder.

In a subsequent interval III, the temperature T is increased more up to a maximum temperature Tmax, which is higher than the melting point $T_\ominus$, so that complete melting of the connecting means 10 is ensured. The melting point $T_\ominus$ may, for example, lie in the range of 220° C.

In a subsequent interval IV, the pressure p62 is increased to a maximum pressure p62max, for example 50 bar, and the pressure p61 is increased to ambient pressure $p_R$, for example 1 bar, so that the maximum differential pressure $\Delta p\_max$ in the example mentioned is 49 bar. Optionally, the pressure p61 may be brought again to ambient pressure $p_R$ in the interval IV. Increasing the pressure p62 with melted connecting means 10 has the effect that the parts 11, 12 to be joined are pressed against one another by the pressure p62. Here the melted connecting means 10 is pressed together to form a very thin layer, which is conducive to alloying through of the solder, since what matters here is that material from at least one of the parts 11, 12 to be joined adjoining the connecting means 10 penetrates into the liquid solder and penetrates through it as completely as possible. A thin solder layer has the effect of reducing the required diffusion paths, which is conducive to alloying through.

In a subsequent interval V, the pressures p62 and p61 as well as the temperature T are kept constantly at a high level, in order to achieve alloying through of the solder that is as complete as possible. With the example according to FIG. 15, it is intended to illustrate that the temperature T can also be increased (interval IV) and/or kept at a high level (interval V) if, due to a high differential pressure $\Delta p$, there is good thermal coupling between the stack 1 and the housing element 71 (except once again in the case of the configurations in which there is only one chamber region 62 that can be subjected uniformly to pressure). As a departure from this, the pressure p61 could, however, also be raised in the interval IV together with the pressure p62 and kept at a high level in the interval V, to be precise in both cases such that the differential pressure $\Delta p = p62 - p61$ is equal to zero, or has only a very low value, for example less than 1 bar or less than 5 bar.

With a further interval VI, there follows a cooling-down phase, until the temperature T has reached room temperature $T_R$ at the end of the interval VI and the pressure chamber(s) 7 or the chamber regions 61, 62 thereof can be brought to ambient pressure $p_R$. As an alternative to this, the pressure chamber(s) 7 or the chamber regions 61, 62 thereof may be brought to ambient pressure $p_R$ when, or else before, room temperature $T_R$ is reached, as long as the temperature T of the connecting means 10 has fallen to such an extent that the joined stack 1 has sufficient strength.

In the case of the example according to FIG. 16, the closed pressure chamber 7 (in the case of two chamber regions 61 and 62, both chamber regions 61, 62) is (are) initially at normal pressure $p_R$. Then, the pressure chamber 7 (or both chamber regions 61, 62) is (are) evacuated during an interval I at room temperature $T_R$ to a very low absolute pressure, for example less than 50 hPa, so that in the case of two chamber regions 61, 62 there is a differential pressure $\Delta p = p62 - p61$ of exactly zero. These values are kept constant during a subsequent interval II.

In a subsequent interval III, the pressure p62 is brought to a high pressure p62max, for example 41 bar, while the pressure p61 is increased to ambient pressure $p_R$, for example 1 bar, which altogether brings about a rise in the differential pressure Δp=p62−p61 to a maximum value Δ_max of 40 bar. As a result, on the one hand the parts 11, 12 to be joined involved are pressed against one another on account of the high value of p62, on the other hand the high differential pressure Δp (except once again in the case of the configurations in which there is only one chamber region 62 that can be subjected uniformly to pressure) brings about a pressing of the stack 1 in the direction of the first housing element 71.

After that, the temperature T is increased during an interval IV with constantly held pressures p61, p62, until at the end of the interval IV the melting point $T_\ominus$ of the connecting means 10, 22 is reached, so that the latter liquefies and the parts 11, 12 to be joined are pressed against one another by the high value of the pressure p62. On account of the already melted connecting means 10, the latter is pressed together to form a very thin layer.

In order to ensure complete melting of the connecting means 10, the temperature T is increased more in a subsequent interval V beyond the melting point $T_\ominus$ up to a maximum temperature Tmax.

After the pressures p62 and p61 as well as the temperature T are kept constant at a high level during a subsequent interval VI, in order to achieve alloying through that is as complete as possible, there follows in a further interval VII a cooling-down phase, until the temperature T has reached room temperature $T_R$ at the end of the interval VI and the pressure chamber(s) 7 or the chamber regions 61, 62 can be brought to ambient pressure $p_R$.

The temperature and pressure values mentioned in the case of the previous examples are to be understood as merely examples. The same also applies to the relative variations of the pressures p61, p62 and the temperature T. In principle, any other desired values and variations can be set.

In the case of all the configurations of the invention, the pressures p62 and, if required, p61 may be provided by the pressure connections 82 and 81 respectively concerned being connected to compressors and/or vacuum pumps and/or pressure accumulators.

Figure 17:
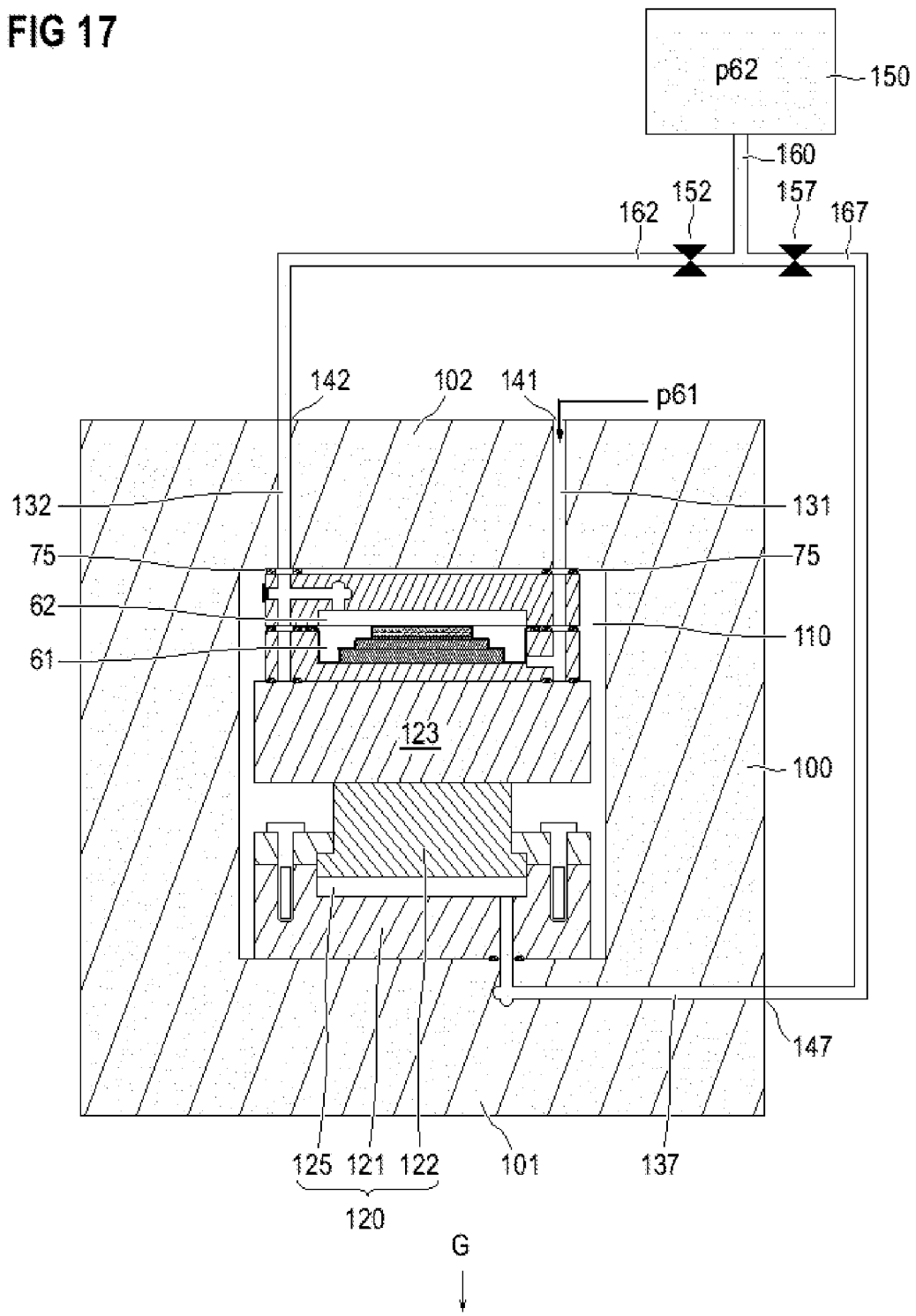
FIG. 17 shows a vertical section through a rigid holding frame to which a working cylinder and a pressure source are fastened.

Likewise, in the case of all configurations of the invention, the second gas pressure p62 may also be used for the purpose of actuating the working cylinder 120, provided that it is formed as a pneumatic cylinder. This is explained by way of example in FIG. 17, in which the arrangement shown in FIGS. 3A to 3D is used by way of example.

A pressure source 150, for example a compressor, which provides a pressure p62, is connected to the pressure connections 142 and 147, respectively, by way of pneumatic connecting lines 160, 162 and 167. In the connecting line 162 between the pressure source 150 and the pressure connection 142 there is a pneumatic valve 152, with which the connecting line 162 can be closed or opened. Correspondingly, in the connecting line 167 between the pressure source 150 and the pressure connection 147 there is a pneumatic valve 157, with which the connecting line 167 can be closed or opened.

Proceeding from the situation shown in FIG. 3B and with the pneumatic valves 152 and 157 closed, first the pneumatic valve 157 may be opened, so that in the working volume 125 of the working cylinder 122 there is the pressure p62 and the piston 122 is moved upward, so that the situation according to FIG. 3C exists, the pressure p120 that is shown in FIG. 3C being identical to p62. In this state, the pressure line 91 (see FIG. 2) is connected to the pressure line 131 and the pressure line 92 (see FIG. 2) is connected to the pressure line 132. Then the pneumatic valve 152 can also be opened, so that the pressure p62 also prevails in the second chamber region 62. Since the pressure p62 now acts on the piston 122 from opposite sides, there is in principle the risk of the piston 122 moving downward in the direction of gravitational force as a result of its own weight and the weight of the filled pressure chamber 7 exerting a load on it, and as a result the connections between the pressure line 91 and the pressure line 131 as well as between the pressure line 92 and the pressure line 132 becoming detached. In order to avoid this, the effective base area of the piston 122 should be greater than the effective base area by which the pressure p62 presses the piston downward. The effective base areas should in this case be respectively determined in a projection plane perpendicular to the direction of gravitational force.

The effective base area of the piston 122 is in this case given by the projected area of the portion of the underside of the piston 122, on which the pressure p62 acts, onto the projection plane.

Correspondingly, the effective base area by which the pressure p62 presses the piston downward is given by the total projected area of the portion or the portions of the adapter plate 123 and of the pressure chamber 7 onto the projection plane, onto which the pressure p62 exerts on the piston a downwardly directed force, in the direction of gravitational force. In the examples shown, this effective base area is substantially given by the sum of the projected area of the interior space 6 onto the projection plane and the projected areas of the entry openings 83 and 85, respectively, located on the underside 77 of the pressure chamber 7, onto the projection plane.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a bond, the method comprising:
    providing a holding frame having a receiving region;
    providing a pressure chamber having a first housing element and a second housing element; and
    for the pressure chamber:
        providing a first part, a second part, a connecting means and a sealing means;
        loading the pressure chamber with the first part, the second part and the connecting means in such a way that the connecting means is to be positioned between the first part and the second part, at least the connecting means being arranged in a first chamber region of the pressure chamber;
        placing the loaded pressure chamber into the receiving region;

pressing the first housing element of the pressure chamber against the second housing element of the pressure chamber so that the pressure chamber placed in the receiving region is clamped with the aid of a working cylinder between the working cylinder and the holding frame; and generating in a second chamber region of the pressure chamber a second gas pressure, which is higher than a first gas pressure in the first chamber region, so that the first part, the second part and the connecting means are pressed against one another to form a bond.

2. The method of claim 1, further comprising:
heating the first part, the second part and the connecting means to a predetermined temperature which is greater than room temperature, while the second gas pressure prevails in the second chamber region; and
subsequently cooling the first part, the second part and the connecting means.

3. The method of claim 1, wherein the holding frame has a first leg and a second leg rigidly connected the first leg and the receiving region is located between the first leg and the second leg.

4. The method of claim 1, wherein the sealing means is formed as a film which forms a gastight closed bag in which the first part, the second part and the connecting means are arranged.

5. The method of claim 1, wherein the sealing means is formed as a film which, as a result of the pressing, is clamped between the first housing element and the second housing element of the pressure chamber and separates the first chamber region from the second chamber region, and the first part, the second part and the connecting means are located in the first chamber region after the clamping of the film between the first housing element and the second housing element.

6. The method of claim 1, wherein at least one of the first and second parts is a metallized ceramic substrate having a base area which is a side of the ceramic substrate with a largest surface area.

7. The method of claim 1, wherein the first part is a metallized ceramic substrate and the second part is a semiconductor chip.

8. The method of claim 1, wherein the first part is a metal plate and the second part is a metallized ceramic substrate.

9. The method of claim 1, wherein the working cylinder has a maximum stroke less than or equal to 5 mm.

10. The method of claim 1, wherein the working cylinder is a pneumatic cylinder or a hydraulic cylinder.

11. The method of claim 10, wherein the pneumatic cylinder has a working volume, and the first housing element is pressed against the second housing element by the working volume being fed a working pressure, the working pressure being fed from the same pressure source as the second gas pressure.

12. The method of claim 11, wherein a maximum of the working pressure is at least 21 bar.

13. The method of claim 1, wherein the connecting means is a solder.

14. The method of claim 1, wherein for at least one of the pressure chambers the connecting means is a sinterable paste containing metal flakes and/or a metal powder, and also a solvent.

15. The method of claim 1, wherein at least two pressure chambers are provided, loaded, placed in the receiving region, and arranged one on top of the other so as to form a stack in the clamped state.

16. The method of claim 1, wherein the first part is a leadframe having a dielectric ceramic platelet coated with a metallization and the second part is a semiconductor chip bonded to the leadframe.

17. The method of claim 16, further comprising:
providing an electrically conducting contact element and a module housing;
establishing a mechanical connection and an electrically conducting connection between the contact element and the bond; and
arranging the bond in an interior of the module housing so that the contact element extends from the interior of the module housing to an outer side of the module housing.

18. A method for producing a bond, the method comprising:
providing a holding frame having a receiving region, a working cylinder, and a pressure chamber having a first housing element, a second housing element, a first chamber region and a second chamber region;
loading the pressure chamber with a first part, a second part and a connecting means, with at least the connecting means being arranged in the first chamber region;
placing the loaded pressure chamber into the receiving region;
pressing the first housing element against the second housing element so that the pressure chamber placed in the receiving region is clamped with the aid of the working cylinder between the working cylinder and the holding frame; and
generating in the second chamber region a second gas pressure, which is higher than a first gas pressure in the first chamber region, so that the first part, the second part and the connecting means are pressed against one another to form a bond with the connecting means interposed between the first and second parts.

19. A bonding tool, comprising:
a holding frame having a receiving region;
a working cylinder; and
a pressure chamber having a first housing element, a second housing element, a first chamber region and a second chamber region,
wherein the pressure chamber is configured to receive a first part, a second part and a connecting means, with at least the connecting means being arranged in the first chamber region,
wherein the pressure chamber is configured to be placed in the receiving region,
wherein the first housing element is configured to be pressed against the second housing element so that the pressure chamber placed in the receiving region is clamped with the aid of the working cylinder between the working cylinder and the holding frame,
wherein the second chamber region is configured to generate a second gas pressure, which is higher than a first gas pressure in the first chamber region, so that the first part, the second part and the connecting means are pressed against one another to form a bond with the connecting means interposed between the first and second parts.

* * * * *

UNITED STATES PATENT AND TRADEMARK OFFICE
CERTIFICATE OF CORRECTION

| | | |
|---|---|---|
| PATENT NO. | : 9,202,800 B2 | Page 1 of 1 |
| APPLICATION NO. | : 13/939635 | |
| DATED | : December 1, 2015 | |
| INVENTOR(S) | : T. Hong | |

It is certified that error appears in the above-identified patent and that said Letters Patent is hereby corrected as shown below:

In the claims

Column 21, line 21 please change "connected the" to -- connected to the --

Signed and Sealed this
Twelfth Day of April, 2016

Michelle K. Lee
*Director of the United States Patent and Trademark Office*